US007224752B2

(12) United States Patent
Sugar et al.

(10) Patent No.: US 7,224,752 B2
(45) Date of Patent: May 29, 2007

(54) SYSTEM AND METHOD FOR REAL-TIME SPECTRUM ANALYSIS IN A COMMUNICATION DEVICE

(75) Inventors: Gary L. Sugar, Rockville, MD (US); Karl A. Miller, Frederick, MD (US); Jong Sup Baek, Rockville, MD (US)

(73) Assignee: Cognio, Inc., Germantown, MD (US)

( * ) Notice: Subject to any disclaimer, the term of this patent is extended or adjusted under 35 U.S.C. 154(b) by 582 days.

(21) Appl. No.: 10/757,704

(22) Filed: Jan. 14, 2004

(65) Prior Publication Data

US 2004/0156440 A1 Aug. 12, 2004

Related U.S. Application Data

(63) Continuation of application No. 10/246,365, filed on Sep. 18, 2002, now Pat. No. 6,714,605.

(60) Provisional application No. 60/319,542, filed on Sep. 11, 2002, provisional application No. 60/319,435, filed on Jul. 30, 2002, provisional application No. 60/380,890, filed on May 16, 2002, provisional application No. 60/374,365, filed on Apr. 22, 2002.

(51) Int. Cl.
*H03D 1/00* (2006.01)
*H04L 27/06* (2006.01)

(52) U.S. Cl. ............... 375/340; 375/259; 375/224; 375/228

(58) Field of Classification Search ............... 375/340, 375/259, 224, 228, 316; 73/579; 324/76.21, 324/76.19, 76.22–76.25, 76.43, 76.47, 76.52–76.57; 455/226.1, 226.2; 702/75.77
See application file for complete search history.

(56) References Cited

U.S. PATENT DOCUMENTS 3,992,666 A 11/1976 Edwards et al. .......... 324/77 R (Continued)

FOREIGN PATENT DOCUMENTS

CA 2260336 8/2000

(Continued)

OTHER PUBLICATIONS

Medav, Dr Hans-Joachim Kolb, "Short Time Spectral Analysis Of Audio Signals On A PC," date unknown.

(Continued)

*Primary Examiner*—Phuong Phu
(74) *Attorney, Agent, or Firm*—Edell, Shapiro & Finnan, LLC

(57) ABSTRACT

A spectrum analysis engine (SAGE) that comprises a spectrum analyzer component, a signal detector component, a universal signal synchronizer component and a snapshot buffer component. The spectrum analyzer component generates data representing a real-time spectrogram of a bandwidth of radio frequency (RF) spectrum. The signal detector detects signal pulses in the frequency band and outputs pulse event information entries output, which include the start time, duration, power, center frequency and bandwidth of each detected pulse. The signal detector also provides pulse trigger outputs which may be used to enable/disable the collection of information by the spectrum analyzer and the snapshot buffer components. The snapshot buffer collects a set of raw digital signal samples useful for signal classification and other purposes. The universal signal synchronizer synchronizes to periodic signal sources, useful for instituting schemes to avoid interference with those signals.

18 Claims, 20 Drawing Sheets

U.S. PATENT DOCUMENTS

| | | | |
|---|---|---|---|
| 4,054,785 A | 10/1977 | Lehmann | 708/405 |
| 4,084,245 A | 4/1978 | Bunge | 364/485 |
| 4,166,980 A | 9/1979 | Apostolos et al. | 325/363 |
| 4,227,255 A | 10/1980 | Carrick et al. | 455/226 |
| 4,336,541 A | 6/1982 | Tsui et al. | 343/18 E |
| 4,501,020 A | 2/1985 | Wakeman | 455/226 |
| 4,597,107 A | 6/1986 | Ready et al. | 455/226 |
| 4,818,949 A | 4/1989 | Cohen | 324/77 B |
| 4,839,582 A | 6/1989 | Fukaya et al. | 324/77 B |
| 4,947,338 A | 8/1990 | Vistica | 364/485 |
| 4,950,999 A | 8/1990 | Agnello et al. | 324/76.22 |
| 5,005,210 A | 4/1991 | Ferrell | 455/115 |
| 5,144,642 A | 9/1992 | Weinberg et al. | 375/10 |
| 5,210,820 A | 5/1993 | Kenyon | 395/2 |
| 5,230,087 A | 7/1993 | Meyer et al. | 455/67.1 |
| 5,271,036 A | 12/1993 | Lobert et al. | 375/227 |
| 5,303,262 A | 4/1994 | Johnson | 379/454 |
| 5,323,337 A | 6/1994 | Wilson et al. | 364/574 |
| 5,432,862 A | 7/1995 | Hirsch | 382/207 |
| 5,436,556 A | 7/1995 | Komninos | 324/76.23 |
| 5,565,764 A * | 10/1996 | Priebe et al. | 324/76.21 |
| 5,574,979 A | 11/1996 | West | 455/63.1 |
| 5,697,078 A | 12/1997 | Peterson et al. | 455/190 |
| 5,706,202 A | 1/1998 | Itahara et al. | 702/77 |
| 5,745,777 A | 4/1998 | English et al. | 395/800 |
| 5,808,463 A | 9/1998 | Nagano | 324/76.21 |
| 5,905,949 A | 5/1999 | Hawkes et al. | 455/410 |
| 5,956,638 A | 9/1999 | Chang et al. | 455/423 |
| 6,084,919 A | 7/2000 | Kleider et al. | 375/285 |
| 6,130,907 A | 10/2000 | Chen | 375/200 |
| 6,229,997 B1 | 5/2001 | Addy | 455/226.1 |
| 6,229,998 B1 | 5/2001 | Hamdy et al. | 455/226.1 |
| 6,233,529 B1 | 5/2001 | Nonaka | 702/76 |
| 6,349,198 B1 | 2/2002 | Carlson et al. | 455/63.1 |
| 6,374,082 B1 | 4/2002 | Carlson | 455/63.1 |
| 6,385,434 B1 | 5/2002 | Chuprun et al. | 455/11.1 |
| 6,484,111 B1 | 11/2002 | Nara | 702/77 |
| 6,509,728 B1 | 1/2003 | Uchino et al. | 324/76.15 |
| 6,512,788 B1 | 1/2003 | Kuhn et al. | 375/224 |
| 6,584,419 B1 | 6/2003 | Alexander | 702/68 |
| 6,714,605 B2 * | 3/2004 | Sugar et al. | 375/340 |
| 2001/0055952 A1 | 12/2001 | Ficarra | 455/67.3 |
| 2002/0086641 A1 | 7/2002 | Howard | 455/67.1 |
| 2002/0142744 A1 | 10/2002 | Okanoue et al. | 455/226.1 |
| 2002/0154614 A1 | 10/2002 | Jagger et al. | 370/332 |
| 2002/0155811 A1 | 10/2002 | Prismantas et al. | 455/63 |
| 2002/0177446 A1 | 11/2002 | Bugeja et al. | 455/450 |
| 2003/0050014 A1 | 3/2003 | Cain | 455/67.1 |
| 2003/0067662 A1 | 4/2003 | Brewer et al. | 359/189 |
| 2003/0123420 A1 | 7/2003 | Sherlock | 370/338 |
| 2003/0198200 A1 | 10/2003 | Diener et al. | 370/329 |
| 2003/0198304 A1 | 10/2003 | Sugar et al. | 375/340 |
| 2003/0224741 A1 | 12/2003 | Sugar et al. | 455/115.1 |
| 2004/0028123 A1 | 2/2004 | Sugar et al. | 375/224 |

FOREIGN PATENT DOCUMENTS

| | | |
|---|---|---|
| CA | 2298316 | 8/2000 |

OTHER PUBLICATIONS

Agilent publication, "Agilent PSA Performance Analyzer Series Swept And FFT Analysis, Product Note," 2000.

Agilent Publication, "Agilent 89400 Series Vector Signal Analyzer Product Overview," 2000.

Agilent Publication, "Agilent Technologies: 2G & 3G Solutions-Accelerating Progress," 2002.

Agilent Publication, "Agilent Technologies: Powerful Solutions To Complex Measurement Problems; Burst, Transient + Modulated Signal Analysis," 2000.

Agilent Publication, "Agilent PN 89400-8 Using Vector Modulation Analysis In The Integration, Troubleshooting And Design Of Digital RF Communication Systems," 2000 (and earlier).

Agilent Publication, "Agilent PN 89400-10 Time-Capture Capabilities Of The Agilent 89400 Series Vector Signal Analyzers," 2000 (and earlier).

Agilent Publication, "Agilent 89440A-1 Frequency And Time-Selective Power Measurements With The Agilent 89410A And 89440A," 2001 ( and earlier).

Canadian Communications Research Center, "Spectrum Explorer Project Of Canadian Communications Research Center," 1998 (and later).

Stanford Research Systems, "Stanford Research Systems SR785 Two Channel Dynamic Signal Analyzer," 1998.

Agilent Publication, "Agilent Technologies Vector Signal Analyzer: Open New Windows For Alcatel Space Satellite Communications Business: Case Study," May 24, 2001.

Medav, Dr. Hans-Joachim Kolb, "Signal Processing And Neural Networks In Surveillance And Radio Monitoring," Excerpt from ETH Zurich, 1993.

Agilent Publication, "Agilent Technologies: Select The Right Agilent Signal Analyzer For Your Needs," 2003 (and earlier).

MEDAV, "Medav Astrid Analysis System For Telecom Signals, Recognition, Interception And Demodulation Of HF/VHF/UHF Radio Signals From 0 To 2 GHz," 2000.

MEDAV, "Medav OC-6040 PC-based 4-Channel Analyser and Demodulator for Narrowband COMINT Signals with Automatic Signal Recognition and Text Decoding Capability," 2002.

MEDAV, "Medav DSP-Kit Metlab TM- Toolbox For Real-Time Measurement Acquisition," date unknown.

MEDAV, "Medav Spektro-Kit; Online Spectrogram Analysis On A PC," date unknown.

Tektronix, "Net Tek® BTS Transmitter And Interference Analyzer Ybt250", Sep. 2002.

Boudreau, Daniel et al., "Monitoring Of The Radio-Frequency Spectrum With A Digital Analysis System", Jun. 27, 2000, Proceedings of the 15th International Wroclaw Symposium and Exhibition on Electromagnetic Compatibility.

BBN Technologies, "Using Signal Processing To Analyze Wireless Date Traffic," May 22, 2002, BBN Technical Memorandum No. 1321, prepared for DARPA.

Carlemalm, Catharina, "Suppression Of Multiple Narrowband Interferers In A Spread-Spectrum Communication System," Aug. 2000, IEEE Journal on Selected Areas in Communications, Special Issue on Broadband Communications, vol. 18.

Boudreau, Daniel et al., "A Fast Automatic Modulation Algorithm And Its Implementation In A Spectrum Monitoring Radio Signals", Oct. 2000, Milcom 2000.

Lo, Victor Yeeman, "Enhanced Spectral Analysis Tool (SAT) For Radio Frequency Interference Analysis And Spectrum Management," Milcom, 1998.

MEDAV, "Astrid++ Analysis, Monitoring, Recording And Multi-Channel Direction Finding Of Wideband Application," 2000.

Tektronix, "Real-Time Spectrum Analysis Tools Aid Transition To Third-Generation Wireless Technology," 1999.

Patenaude, Francois et al., "Spectrum Surveillance: System Architecture," CRC-TN-97-001, Canadian Communications Research Centre, Apr. 15, 1997.

Oscor, "Oscor 5000 Omni-Spectral Correlator," publication date unknown.

Anritsu, "MS2711A Handheld Spectrum Analyzer," May 2000.

PCT Search Report from counterpart PCT application No. PCT/US03/ 12376 filed Apr. 22, 2003.

* cited by examiner

FIG. 12

| Number of Stats Update Cycles With: | |
|---|---|
| No Peaks | 2 |
| 1 Peak | 0 |
| 2 Peaks | 1 |
| 3 Peaks | 3 |
| 4 Peaks | 0 |
| 5 Peaks | 0 |
| 6 Peaks | 0 |
| 7 Peaks | 0 |
| 8 Peaks | 0 |
| 9 Peaks | 0 |

FIG. 14

| SAGE Address SDADDR[15:0] | DPR Word (32-bit) | MCU Internal Address | AHB Word Address MDADDR[15:0] | AHB Byte Enable MDBYTEEN[3:0] |
|---|---|---|---|---|
| 0000h | Word 0 | XXXX0000h | XXXX0000h | 0 |
| 0001h | Word 1 | XXXX0004h | XXXX0001h | 0 |
| 0002h | Word 2 | XXXX0008h | XXXX0002h | 0 |
| FFFFh | Word 65,535 | XXX3FFFCh | XXXXFFFFh | 0 |

SYSTEM AND METHOD FOR REAL-TIME SPECTRUM ANALYSIS IN A COMMUNICATION DEVICE

This application is a continuation of U.S. application Ser. No. 10/246,365, filed Sep. 18, 2002 now U.S. Pat. No. 6,714,605, which application in turn claims priority to the following U.S. Provisional Patent Applications:
U.S. Application No. 60/374,365, filed Apr. 22, 2002.
U.S. Application No. 60/380,890, filed May 16, 2002.
U.S. Application No. 60/319,435, filed Jul. 30, 2002.
U.S. Application No. 60/319,542, filed Sep. 11, 2002.
The entirety of each of the aforementioned applications is incorporated herein by reference.

RELATED APPLICATIONS

This application is related to each of the following commonly assigned U.S. Non-Provisional Applications, filed on Sep. 18, 2002 (the entirety of each of which is incorporated herein by reference):
U.S. application Ser. No. 10/246,364, entitled "System and Method for Classification of Unknown Signals in a Frequency Band."
U.S. application Ser. No. 10/246,363, entitled "System and Method for Spectrum Management of a Shared Frequency Band."

BACKGROUND OF THE INVENTION

The present invention is directed to technology used in a radio communication device to derive information about the signals active in a radio frequency band where the radio communication device is operating, such as an unlicensed radio frequency band shared by many different devices.

In certain radio communication systems, it would be desirable to know whether and what types of other signals or devices are active. For example, an unlicensed radio frequency band is, by its nature, free to be used by any device that emits radiowave energy within certain power levels in that part of the allocated spectrum. It is possible that many devices would share the unlicensed frequency band at the same time, potentially causing interference with each other. Under these circumstances, what would be useful is to provide the capability of processing signals that represent activity in the frequency spectrum over a time interval to derive information about the basic characteristics of those signals in order to identify or classify them.

SUMMARY OF THE INVENTION

A real-time spectrum analysis engine (SAGE) is provided that generates information about the signal activity in a frequency band. The SAGE has several components to produce generalized spectrum information as well as specific information concerning the type of signal pulses in the frequency band at any given time.

The SAGE is, for example, a hardware accelerator that resides in a communication device and comprises a spectrum analyzer component, a signal detector component, a universal signal synchronizer component and a snapshot buffer component. The spectrum analyzer component generates data representing a real-time spectrogram of a bandwidth of radio frequency (RF) spectrum. The signal detector detects signal pulses in the frequency band and outputs pulse event information entries which include the start time, duration, power, center frequency and bandwidth of each detected pulse. The signal detector also provides pulse trigger outputs which may be used to enable/disable the collection of information by the spectrum analyzer and the snapshot buffer components. The snapshot buffer collects a set of raw digital signal samples useful for signal classification and other purposes. The universal signal synchronizer synchronizes to periodic signal sources, useful for instituting schemes to avoid interference with those signals. Some or al of the functions of the SAGE may be implemented entirely in software executed by a processor.

The above and other objects and advantages will become readily apparent when reference is made to the following description taken in conjunction with the accompanying drawings.

BRIEF DESCRIPTION OF THE DRAWINGS

FIG. 12 is a diagram showing the exemplary peak stats that are accumulated by the stats logic module.

FIG. 14 is a diagram showing the addressing scheme for data stored in the DPR.

DETAILED DESCRIPTION OF THE DRAWINGS

Figure 1:
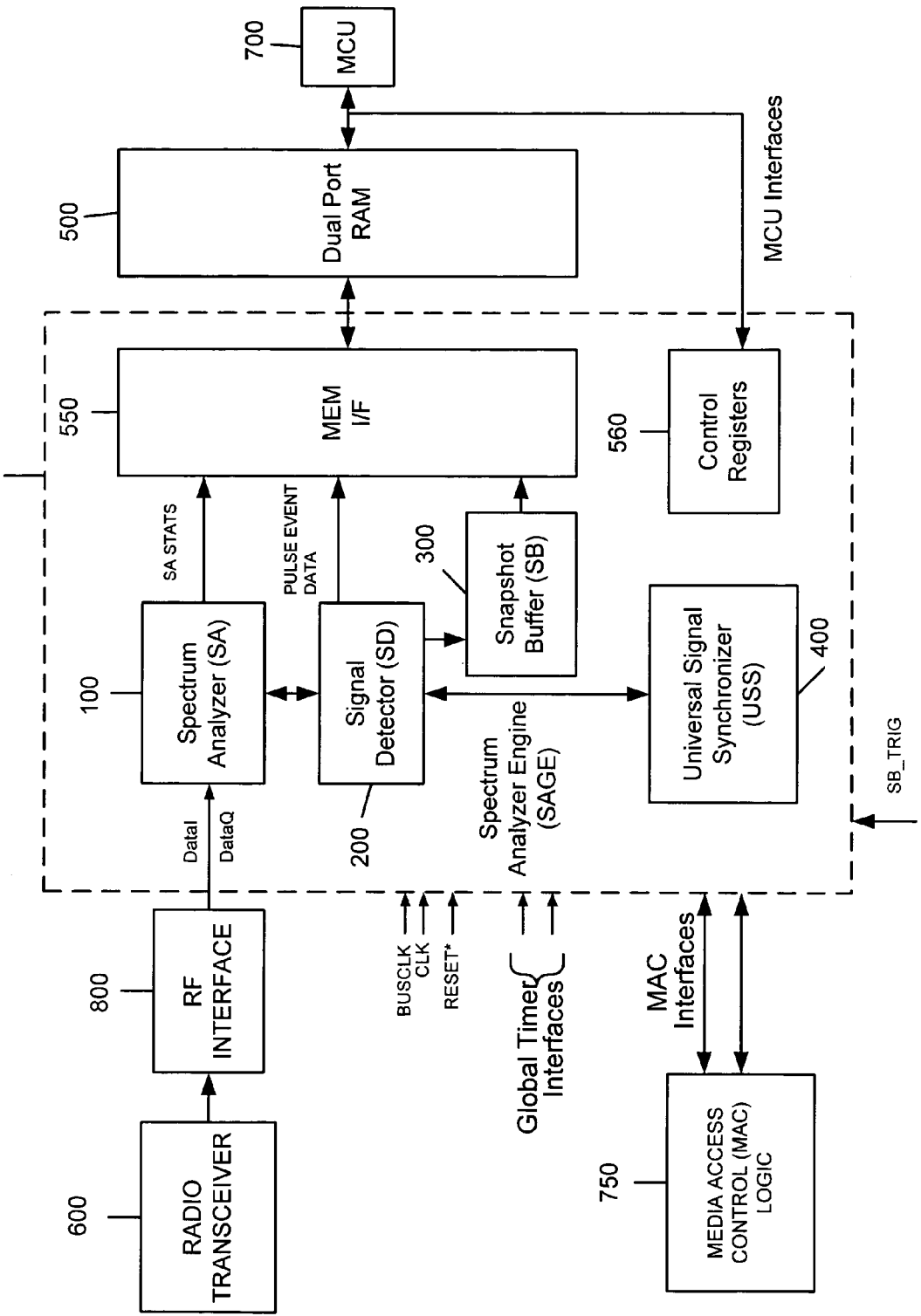
FIG. 1 is a block diagram showing the spectrum analysis engine (SAGE).

The spectrum analysis engine, hereinafter referred to as "SAGE" is a hardware accelerator useful to generate in real-time information about the activity in a frequency band. FIG. 1 is a block diagram showing the SAGE 10 together with other hardware components that SAGE interacts with during operation. The SAGE 10 and related components may be implemented in a variety of ways. One way is with field programmable gate arrays (FPGAs) on a single or multiple semiconductor chips configured to perform the functions described herein. Another way is in one or more semiconductor devices using a CMOS process. For example, the majority of the SAGE 10 can be implemented as part of or the entirety of an application specific integrated circuit (ASIC). It is also envisioned that for certain applications, some or all of the functions of the SAGE 10 are implemented with software instructions stored on a processor readable medium, and executed by a processor, such as the MCU, or another processor in another device coupled to receive as input the output an ADC that converts the downconverted signals to a digital signal. An example of one software implementation of the SAGE 10 is described hereinafter in connection with FIG. 21.

The SAGE 10 comprises a spectrum analyzer (SA) 100, a signal detector (SD) 200, a snapshot buffer (SB) 300 and a universal signal synchronizer (USS) 400. The SA 100 generates data representing a real-time spectrogram of a bandwidth of radio frequency (RF) spectrum, such as, for example, up to 100 MHz. As such, the SA 100 may be used to monitor all activity in a frequency band, for example, the 2.4–2.483 GHz ISM band, or the 5.15–5.35 GHz and 5.725–5.825 GHz UNII bands. Power vs. frequency information generated by SAGE 10 is stored in a dual-port RAM (DPR) 500 and is also used by the signal detector 200.

The signal detector 200 detects signal pulses in the frequency band and outputs pulse event information entries, which include one or more of the start time, duration, power, center frequency and bandwidth of each detected pulse. The signal detector 200 also provides pulse trigger outputs which may be used to enable/disable the collection of information by the spectrum analyzer 100 and the snapshot buffer 300 components.

The snapshot buffer 300 collects a set of raw digital signal samples useful for signal classification and other purposes, such as time of arrival location measurements. The snapshot buffer 300 can be triggered to begin sample collection from either the signal detector 200 or from an external trigger source using the snapshot trigger signal SB_TRIG.

The universal signal synchronizer 400 synchronizes to periodic signal sources, such as Bluetooth SCO headsets and cordless phones. The USS 400 interfaces with medium access control (MAC) logic 750 that manages scheduling of packet transmissions in the frequency band according to a MAC protocol, such as, for example, the IEEE 802.11 protocols. The MAC logic 750 may be implemented in DSP firmware, or in higher level software.

The SAGE 10 is useful in a radio communication device where a radio transceiver 600 (or a radio receiver) is used to process received RF signals and convert them to baseband signals. A microprocessor control unit (MCU) 700 interfaces with the SAGE 10 to receive spectrum information output by SAGE 10, and to control certain operational parameters of SAGE 10 for particular functions described in detail hereinafter. The MCU 700 may be any suitable microprocessor that resides either on the same semiconductor chip as the SAGE 10, or on another chip. The MCU interfaces with SAGE 10 through the DPR 500 and the control registers 560. The SAGE 10 interfaces with the MCU 700 through a memory interface (I/F) 550 that is coupled to the DPR 500.

The control registers 560 include registers to enable the MCU 700 to configure control and monitor the SAGE 10. There is a control/status register, an interrupt enable register, an interrupt flags register, spectrum analyzer control registers, signal detector control registers, snapshot buffer control registers and USS control registers. The control/status register includes a field to perform a reset of the SAGE components. The interrupt enable register is used to indicate one or more pending interrupt conditions to the MCU 700. The MCU 700 also uses the interrupt flags register to clear any processed interrupts.

Two clock signals are used to drive the SAGE 10. The main clock signal, CLK, runs at the sampling rate of the ADC 810 and controls most of the SAGE logic. The other clock, BUSCLK, is used to control the MCU side of DPR 500, interface to the control registers 560, the global timer interfaces (GFIs), and the lower medium access control (LMAC) interfaces. The DPR 500 is driven using a separate clock on each port: CLK on the SAGE side and BUSCLK on the MCU side. The control registers 560 may be double-buffered to avoid synchronization problems between SAGE and MCU control logic.

The SAGE 10 operates on digital signals derived from the baseband signals output by the radio transceiver 600. An RF interface 800 is provided that pre-processes the baseband signals for processing by the SAGE 10.

Figure 2:
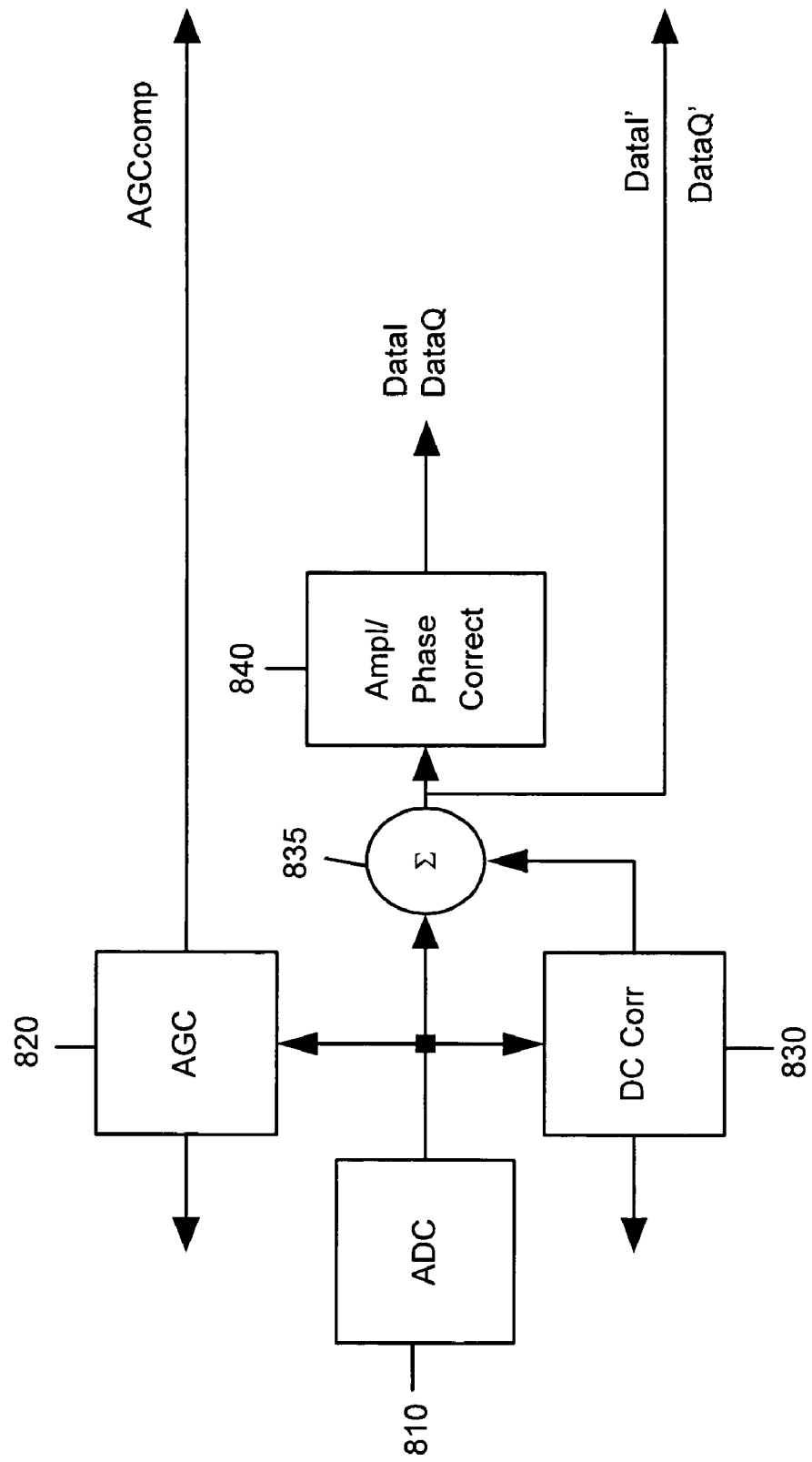
FIG. 2 is a block diagram of a radio transceiver interface that interfaces the SAGE to a radio transceiver or radio receiver.

Turning to FIG. 2, the RF interface 800 will be described. The RF interface 800 comprises an analog-to-digital converter (ADC) block 810, an automatic gain control (AGC) block 820, a direct current (DC) correction block 830 and an amplitude/phase correction block 840.

The radio transceiver 600 that generates the received (Rx) baseband signals may have an RF receiver in which the local oscillator (LO) for the quadrature downconverter is placed at the center of the band of interest. As such, DC, amplitude and phase offset compensation circuits are provided before the Fast Fourier Transform (FFT) to maximize LO and sideband suppression.

The Rx baseband signals are sampled at the CLK frequency using two ADCs, one for the in-phase signal (I), and another for the quadrature signal (Q). Only one ADC is shown in FIG. 2 for simplicity. An example of a CLK and ADC frequency is 120 MHz, which is sufficient to digitize the entire 2.4 GHz ISM band. Consequently, the maximum FFT rate is 468.8 kHz (2.13 microseconds per FFT) at CLK=120 MHz, though faster or slower rates may be suitable for other applications.

The AGC block 820 dynamically adjusts the gain of the receiver to optimize the placement of the Rx signal within the dynamic range of the ADC 810. A slow, feedback-driven algorithm is useful, in which the Rx gain is adjusted to place the maximum signal level received in the last T seconds (nominally T=1 second) 6 dB below full-scale on the ADC 810. The use of a "slow" AGC algorithm is beneficial because it prevents the ADC 810 from saturating when sampling the entire frequency band of interest (wideband mode) whenever strong signals appear suddenly in the band, without requiring rapid adjustments in gain which can cause distortion and discontinuities in Rx signal pulses. The output of the AGC 820 is an AGCcomp signal, the use of which is described hereinafter.

The DC correction and amplitude/phase correction blocks 830 and 840, respectively, compensate for LO leakage and amplitude/phase imbalance in the quadrature mixer of the radio transceiver. DC correction is performed adaptively by estimating the DC offset at the ADC output and updating a correction DAC to remove large DC offsets. Any residual DC offset after course correction is removed after the ADC via digital subtraction. The MCU estimates the amplitude and phase imbalance and programs the correction values into the appropriate control registers.

The output of the RF interface 800 comprises a digital signal DataI representing the in-phase received signal and a digital signal DataQ representing the quadrature phase received signal. The signals DataI' and DataQ' represent the output of the summer 835, uncorrected for DC and amplitude/phase, and can be supplied as the raw data to the snapshot buffer 300.

The SAGE 10 can be used in a radio communication device that includes a RF receiver capable of operating in a wideband mode or narrowband mode. In a wideband mode, the RF receiver may downconvert an entire or a substantial portion of a frequency band in which the radio communication device operates. In the wideband mode, the RF interface 800 supplies digital signals representing activity in the entire frequency band for successive time intervals as input to the SAGE 10. In a narrowband mode, the RF receiver may downconvert only a single RF channel or portion of the frequency band, in which case, the RF interface 800 would supply digital signals representing activity in that single RF channel or portion of the frequency band. An example of a radio receiver having a wideband mode as part of a radio transceiver is disclosed in commonly assigned U.S. Provisional Application No. 60/319,434 filed Jul. 30, 2002, the entirety of which is incorporated herein by reference.

Figure 3:
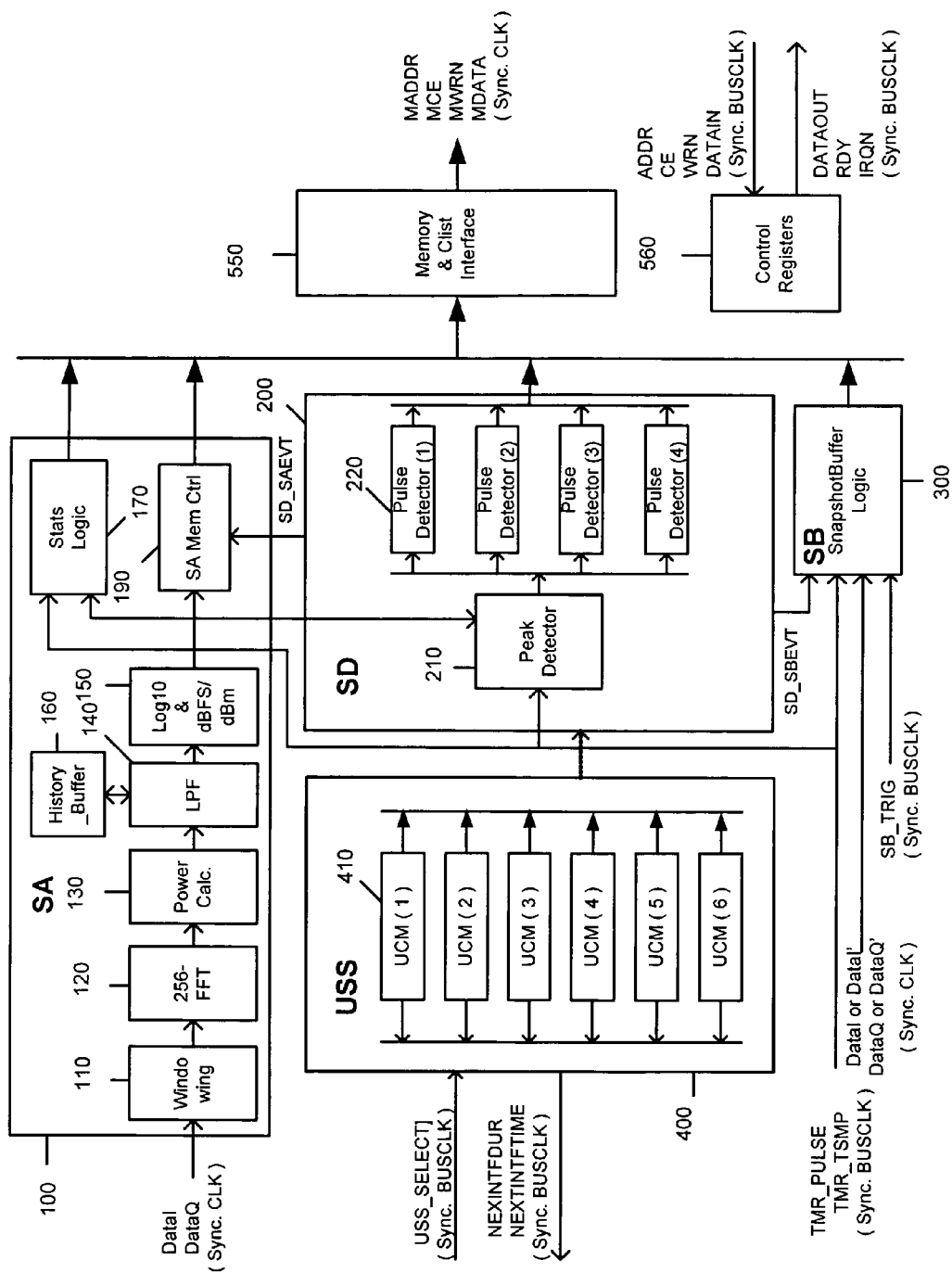
FIG. 3 is a more detailed block diagram of the SAGE.

Turning to FIG. 3, the spectrum analyzer 100, signal detector 200 and snapshot buffer 300 will be described.

The Spectrum Analyzer

Figure 4:
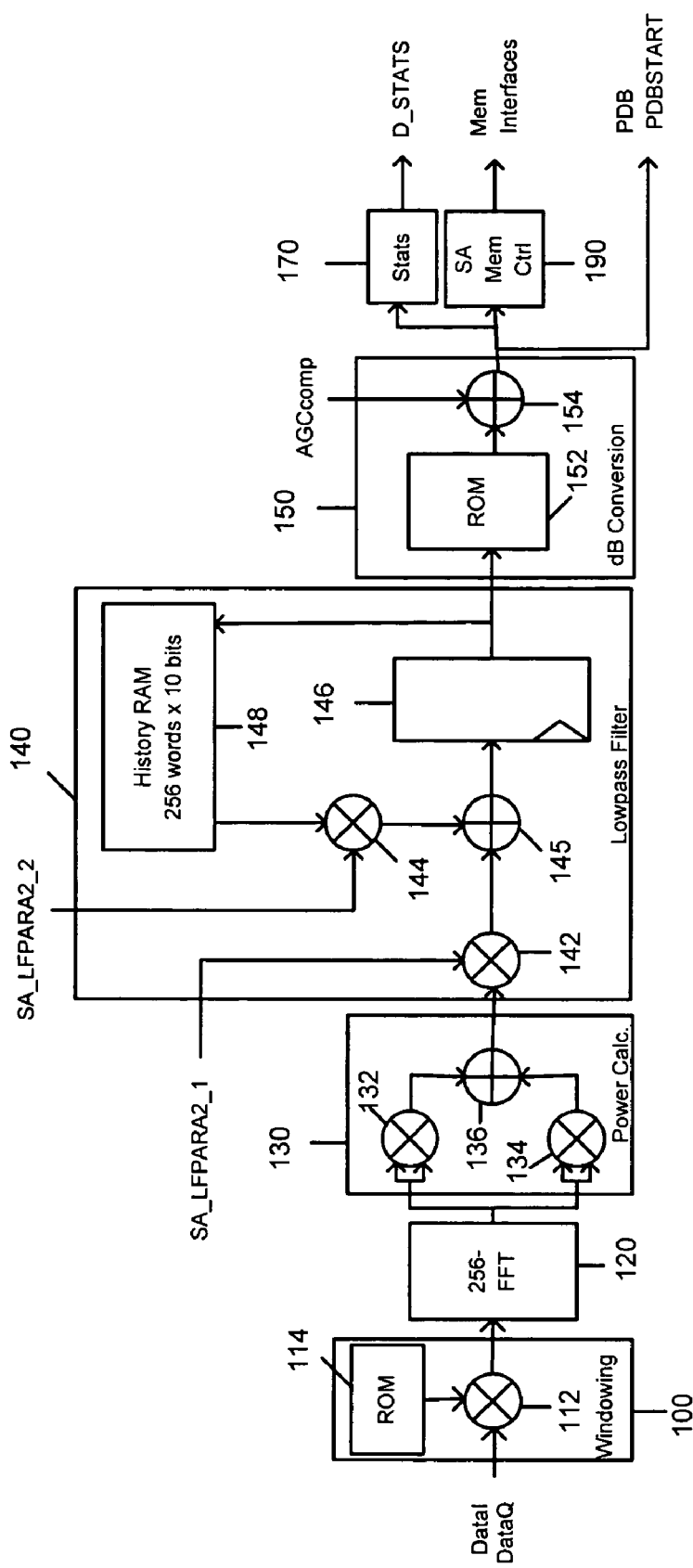
FIG. 4 is schematic diagram of the spectrum analyzer component of the spectrum analysis engine.

With reference to FIGS. 3 and 4, the spectrum analyzer 100 performs real-time FFT-based spectrum analysis on the DataI and DataQ signals. As an example, the SA 100 is capable of providing real-time spectrum analysis information for up to 120 MHz of RF bandwidth, and as such can be used to monitor all activity in either the 2.4 GHz or 5.7 GHz ISM bands. Other applications for monitoring smaller or greater bandwidths are also possible using similar techniques.

The spectrum analyzer 100 comprises a windowing block 110, a Fast Fourier Transform (FFT) block 120, a power calculation block 130, a lowpass filter block 140, a linear-to-log converter (dB conversion) block 150, a history buffer 160, stats logic 170 and a spectrum analyzer memory controller 190.

As shown in FIG. 4, the windowing block 110 performs pre-FFT windowing on the I and Q data using either a Hanning or rectangular window with a multiplier 112 and a ROM 114 that stores slope coefficients for the windowing process.

Figure 5:
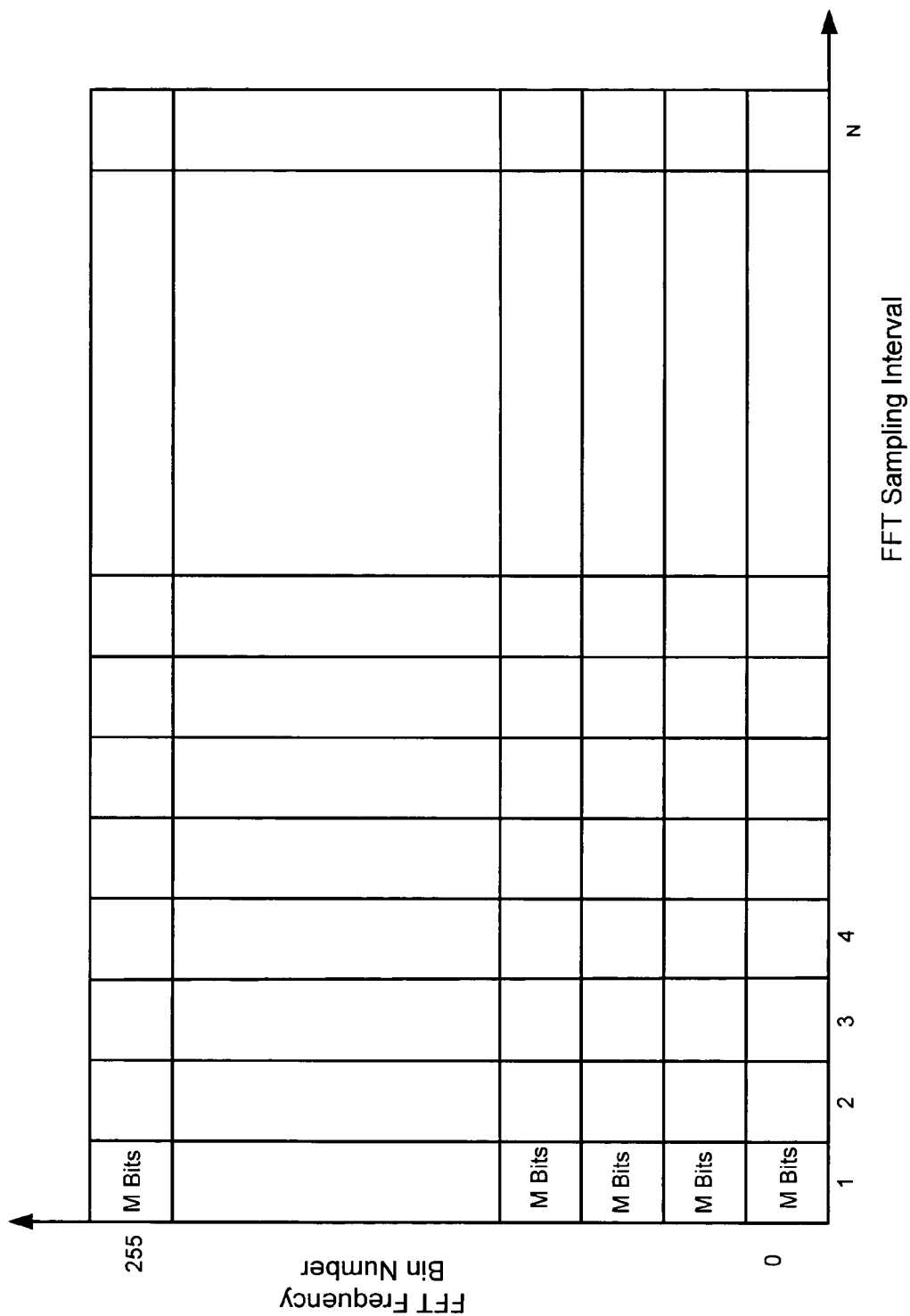
FIG. 5 is a graphical diagram showing a representation of the FFT data generated by the spectrum analyzer.

The output of the windowing block 110 is coupled to the input of the FFT block 120. The FFT block 120 is, for example, a 256 frequency bin FFT block that provides (I and Q) FFT data for each of 256 frequency bins that span the bandwidth of frequency band of interest. An example of the FFT data field is shown in FIG. 5. For each FFT sampling time interval, the FFT block outputs M (such as 10) bits of data for each FFT frequency bin, for example, 256 bins. Thus, it can be seen that two-dimensional data structure can be defined for the FFT data fields across time intervals. This diagram is a useful paradigm to understand the further operations that are performed on the FFT data.

The output of the FFT block 120 is coupled to the power calculation block 130. The power calculation block 130 comprises two multipliers 132 and 134 and an adder 136. The multipliers 132 and 134 compute (FFTdataI)$^2$ and (FFTdataQ)$^2$, respectively, and the adder 136 adds them together, to output a power value.

The lowpass filter block 140 comprises a multiplier 142, multiplier 144, an adder 145, a flip-flop 146 and a history RAM 148. The lowpass filter block 140 performs a unity-gain, single-pole lowpass filtering operation on the power values of the signal at each FFT frequency bin. Using $P_{fft}(k)$ to denote the power value at FFT frequency f(k), the lowpass filter output $P_{lpf}(k)$ is updated once per FFT interval (t) as follows: $P_{lpf}(k, t):=\alpha_1 P(k, t)+(1-\alpha_1)P_{lpf}(k, t-1)$, $1 \leq k \leq 256$, where α1 and (1−α1) are parameters for the multipliers 142 and 144, respectively specifying the LPF bandwidth which is configured by the MCU 700. The history RAM 148 stores the FFT power data for the previous FFT interval that is used with multiplier 144 according to the mathematical relationship described above.

The dB conversion block 150 at the output of the lowpass filter block 140 computes the decibel value PDB(k)=10*log (|$P_{lpf}(k, t)$|) for each FFT bin value $P_{lpf}(k, t)$ (in dBFS, i.e., dB from full-scale on the ADC). The ROM 152 stores a table used for the dB conversion computation and the adder 152 subtracts the gain compensation AGCcomp output by the AGC 820. The output of the dB conversion block is a PDB(k) data field (k=number of frequency bins) containing dB power data at each frequency bin and a PDBSTART signal that indicates the start of the following PDB(k) field.

The stats logic block 170 will be described hereinafter in conjunction with FIG. 10.

The spectrum analyzer 100 has two operating modes for writing data into the DPR 500. In a continuous mode, one power vs. frequency value is written to the DPR 500 every N FFT cycles (N=decimation factor). In a transitional mode, a power vs. frequency value is written whenever a pulse event is detected by the signal detector 200, in response to a spectrum analyzer trigger event signal SD_SAEVT, described hereinafter. The transitional mode generally improves DPR storage efficiency over the continuous mode since in the former case power vs. frequency information is written to the DPR only after pulse transitions.

Examples of control registers for the spectrum analyzer include a control field, a register for the lowpass filter parameter a, registers for the DPR address of the DPR buffers that store the spectrum analyzer stats, a register that counts the number of times the stats have been updated, a register that stores a value that determines the number of FFT intervals for a statistic update cycle, a register that stores the power threshold value for the duty cycle stats (described hereinafter), and a register for the structure for the power vs. frequency circular list.

The spectrum analyzer control register includes fields to, among other things, indicate received signal strength indicator (RSSI) mode, absolute or relative. The relative mode means that power measurements are in units of dB full scale; absolute mode means the measurements are in units of dBm. In addition, there is a field to indicate the operational mode of the spectrum analyzer, continuous mode or transitional mode.

The Signal Detector

Figure 6:
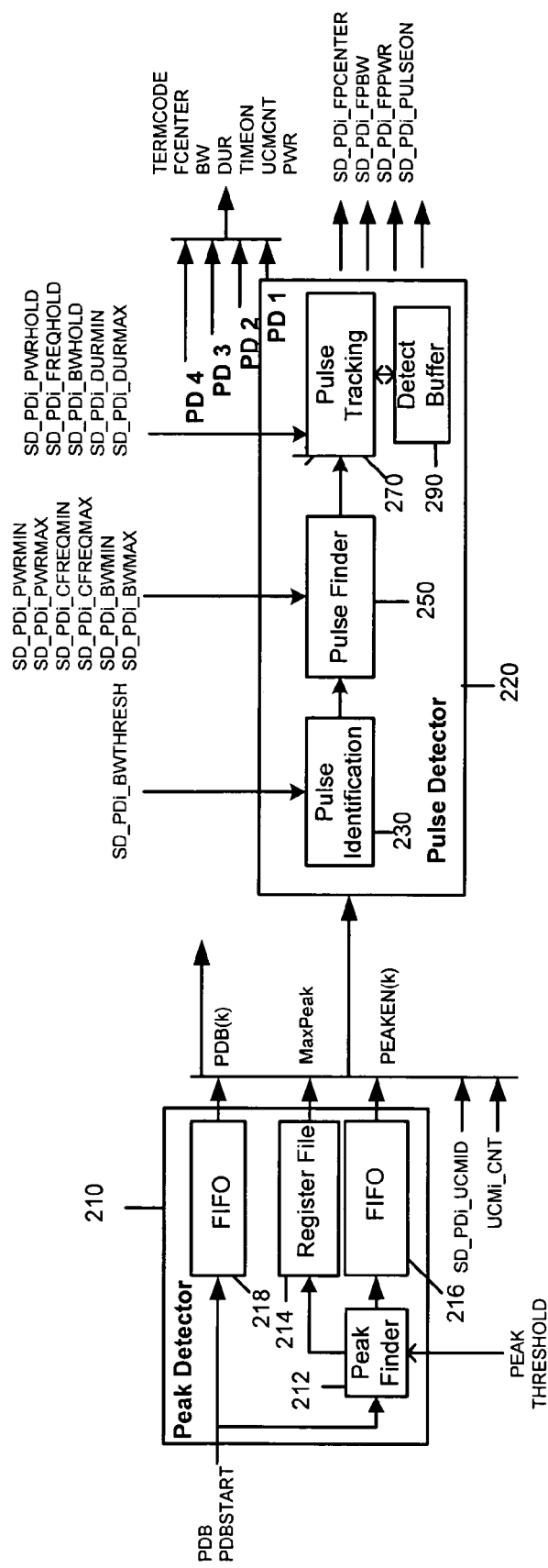
FIG. 6 is a more detailed block diagram of the peak detector and pulse detector components of the spectrum analysis engine.

With reference to FIG. 3 in conjunction with FIG. 6, the signal detector 200 identifies signal pulses in the Rx data path, filters these signals based on their spectral and temporal properties, and passes characteristic information about certain detected pulses to the MCU 700 via the DPR 500. The signal detector 200 also provides pulse timing information to the universal signal synchronizer 400 to allow it to synchronize its clocks to transmissions to/from other devices operating in the frequency band, for example, to eliminate interference with QoS-sensitive devices such as cordless phones, Bluetooth™ headsets, video-over-802.11 devices, etc.

As shown in FIG. 3, the signal detector 200 comprises a peak detector 210 and a one or more pulse detectors 220. For example, there are four (4) pulse detectors 220. The peak detector 210 looks for spectral peaks in the FFT sequence at its input, and reports the bandwidth, center frequency and power for each detected peak. The output of the peak detector is one or more peaks and related information. The pulse detectors 220 detect and characterize signal pulses based on input from the peak detector 210.

The peak detector 210 detects a peak as a set of FFT points in contiguous FFT frequency bins, each above a configured minimum power level. Once per FFT interval, the peak detector 210 outputs data describing those frequency bins that had a FFT value above a peak threshold and which frequency bin of a contiguous set of frequency bins has a maximum value for that set. In addition, the peak detector 210 passes the PDB(k) data field for each FFT interval. This can be represented by the pseudo code (where k is the frequency bin index):

$PDB_{diff}(k)=PDB(k)-SD\_PEAKTH;$ $If(PDB_{diff}(k) \geq 0)$ $PDB_{peak}(k)=PDB(k);$ PEAKEN($k$)=1;

Else $PDB_{peak}(k)=0;$

PEAKEN($k$)=0;

end

The peak detector 210, as shown in FIG. 6, comprises a comparator 212, a register file 214, a FIFO 216 and a FIFO 218. The comparator 212 compares the dB power value PDB(k) with the peak threshold (SD_PEAKTH). The FIFO 216 stores a data word that indicates which frequency bins k had a power value above the peak threshold, and which did not. For example, if the FFT outputs 256 FFT values, the FIFO 216 stores a 256 bit word, with 1's indicating FFT values that exceed the peak threshold and 0's indicating FFT values that do not exceed the peak threshold. The register file 214 stores the maximum peak power value in any set of contiguous FFT values that exceed the peak threshold. This maxpeak information is used in the pulse detector. The FIFO 218 stores the PDB(k) data field corresponding to the data stored in the register file 214 and FIFO 216.

Figure 7:
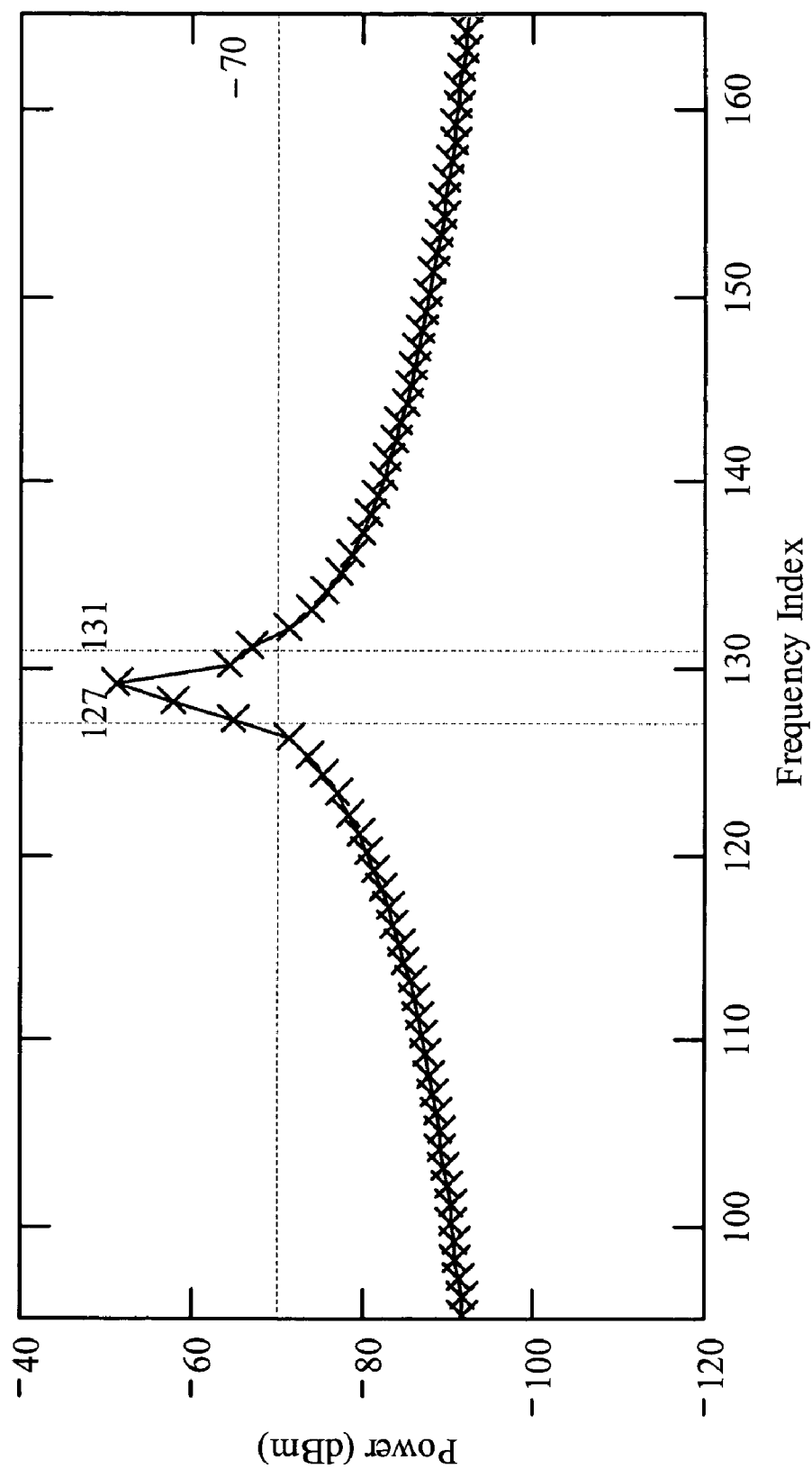
FIG. 7 is a graphical plot showing a signal peak that is detected by the peak detector.

FIG. 7 shows an example where a peak is detected at the frequency bin 130 by a contiguous set of points above a peak threshold shown in the dotted line. In this example, NFFT=256, fs=120 MHz, configured min power level=−80 dBm (not shown), k0=129, k1=127, kh=131, P(k0)=−50 dBm, BW_THRESH=15 dB, bandwidth=1.875 MHz, center frequency=0.4688 MHz. These latter parameters will be described hereinafter in conjunction with the pulse detector 220. The variable fs is the sampling rate of the ADC (FIG. 2), which will depend on the width of the frequency band to be processed. Narrowband and wideband operation of the radio transceiver is described above.

Figure 8:
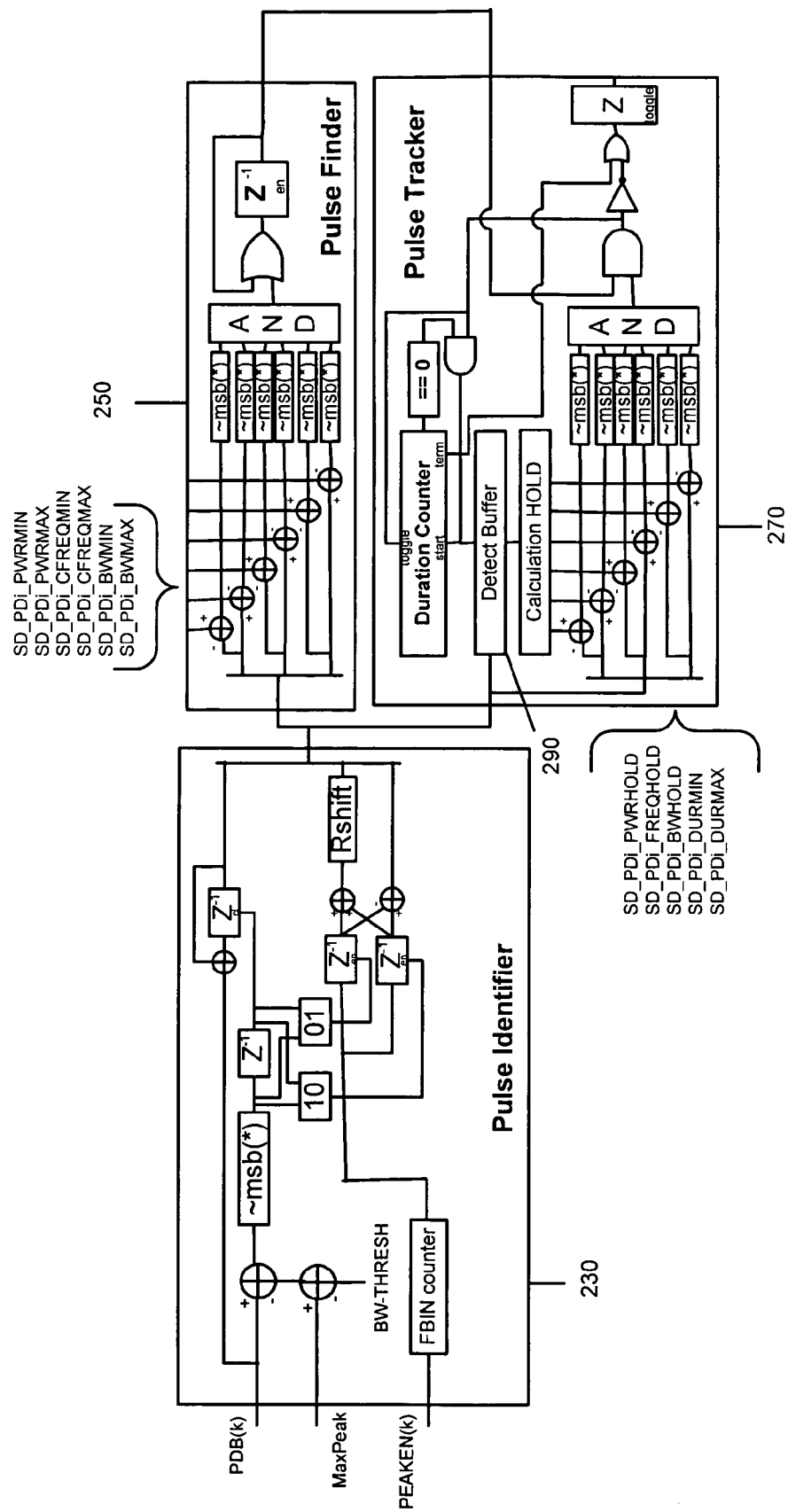
FIG. 8 is a schematic diagram of the components of the pulse detector.

The signal detector 200 has one or more pulse detectors 220 (such as 4), allowing several pulses to be detected and characterized simultaneously. As shown in FIG. 6, each pulse detector 220 comprises a pulse identifier block 230, a pulse finder block 250, a pulse tracking block 270 and a detect buffer 290. These components, described further in conjunction with FIG. 8, are operated with configurable parameters to execute a set of rules:

Pulse Shaping Rules: How should pulse information be extracted from raw peak information-performed by the pulse identifier 230.

Pulse Detection Rules: Under what conditions is the start of a pulse detected—performed by the pulse finder 250.

Pulse Termination Rules: Under what conditions should an individual pulse be considered complete—performed by the pulse tracker 270.

Pulse Shaping Rules.

For a detected FFT peak at frequency index k0, the bandwidth of the peak is defined as $FP_{BW}$=Bandwidth (Hz)= (kh−k1+1)*fs/NFFT, where k1 and kh are the smallest and largest integers, respectively, satisfying (1) k1≦k0≦kh, and (2) P(k)≧P(k0)−BW_THRESH for any k1≦k≦kh, where fs is the ADC sampling rate in Hz, NFFT is the number of points/bins in the FFT, and P(k) denotes the power (in milliwatts) at FFT frequency bin k.

Similarly, the center frequency of the peak is $FP_{CENTER}$=Center Frequency (Hz)=[(kh+k1)/2]*fs/NFFT. This definition of center frequency locates the signal in the Nyquist band only. The actual center frequency at RF is given by RF Center Frequency (Hz)=FPCenter−fs/2+fLO, where fLO is the RF LO frequency used to convert the FFT band to baseband, and a zero-IF receiver architecture is assumed (i.e., the LO is in the center of the RF band).

The peak detector 210 uses the following formula to estimate the power of a peak: Power (dBm)=$\Sigma PDB_{peak}$(k), from k=k1 to kh. This is only an estimate and its accuracy depends on the signal itself and the value of BW_THRESH. The pulse identifier 230 shown in FIG. 8 comprises components to perform the pulse shaping rules using the bandwidth threshold (BW_THRESH) parameter to identify those pulses that have a bandwidth that is greater than or exceeds the bandwidth threshold.

Pulse Detection Rules. The pulse detection rules specify the conditions under which the start of a pulse is to be detected and these rules are performed by the pulse finder 250. For example, a pulse is considered DETECTED if there is a peak from the pulse shaping rules that satisfies ALL of the following conditions:

1) Estimated power is between the peak detector minimum power and the peak detector maximum power. The pulse power level DETECT_POWER which triggered the detection of this specific pulse is used by the pulse termination rules.

2) Center frequency of the peak is between a center frequency minimum and a center frequency maximum. The detected center frequency DETECT_CFREQ is used in pulse termination rules.

3) Bandwidth of the peak is within a bandwidth minimum and a bandwidth maximum.

Pulse Termination Rules. A pulse may be considered TERMINATED if, for example, the pulse duration exceeds a duration maximum, or NONE of the detected peaks from the peak detector satisfies ALL of the following conditions:

1) Estimated power of the peak is within +/− a power hold value of the power of the pulse when it was originally detected.

2) Center frequency of the peak is within +/− a frequency hold value of the center frequency of the peak when it was originally detected.

3) Bandwidth of the peak is within a bandwidth hold value of the bandwidth of the peak when it was originally detected.

The pulse tracker 270 comprises components to detect the termination of a pulse according to these rules.

When a pulse terminates, the pulse detector 220 writes a pulse event entry into the pulse event list if the pulse duration exceeds a pulse duration threshold value. Otherwise, the pulse event entry is discarded. The conditions which terminate the pulse are stored in a bit field which is included in the pulse event structure for the pulse. The pulse event structure will be described hereinafter.

Each pulse detector has its own configuration register (as part of the signal detector control registers) that stores values for each of the pulse parameters (described above) within which a pulse detector will process peak information. The following are examples of these parameters.

PWRMIN: Minimum power threshold (1 dBm)
PWRMAX: Maximum power threshold (1 dBm)
BWTHRESH: Bandwidth threshold (1 dBm)
CFREQMIN: Min center frequency (fs/NFFT Hz)
CFREQMAX: Max center frequency (fs/NFFT Hz)
BWMIN: Min pulse bandwidth (fs/NFFT Hz)
BWMAX: Max pulse bandwidth (fs/NFFT Hz)
DURMAX: Max pulse duration (TMR_PULSE)
DURMIN: Min pulse duration (TMR_PULSE)
PWRHOLD: Power hold value (1 dB)
FRQHOLD: Frequency hold value (fs/NFFT Hz)
BWHOLD: Bandwidth hold value (fs/NFFT Hz)
FPCENTER: Current pulse center frequency (fs/NFFT Hz)
FPBW: Current pulse bandwidth (fs/NFFT Hz)
PWR: Current pulse power estimate (1 dBm)

The terms fs and TMR_PULSE are described above and/or referenced in FIGS. 1–3.

Each pulse detector can be configured by the MCU 700. The MCU 700 writes appropriate values to the configuration register(s) of the signal detector to configure one or more pulse detectors to look for and characterize a certain type of pulse in the frequency band. The control register controls clearing and resetting of a pulse detector so that it can be reconfigured to look for a different type of pulse. The pulse detector control register includes a field that identifies which, if any, universal clock module of the universal signal synchronizer 400 is to be associated with the pulse detector. The universal clock module (UCM) is described hereinafter. When there is an association between the pulse detector and the universal clock module, the pulse detector stores the counter value of that universal clock module into the pulse event list whenever it detects a pulse. The counter values can be used by the MCU 700 to phase lock a universal clock module to a periodic interference source, as described hereinafter.

Each pulse detector outputs pulse event data for storage in the DPR 500. The following is an example of pulse event data.

SDID: Pulse detector identifier.
TERMCODE: Pulse termination codes:
  Bit 0 (LSB): Pulse power outside of hold range
  Bit 1: Center frequency outside of hold range
  Bit 2: Bandwidth outside of hold range
  Bit 3: Duration exceeds durMax FCENTER: Center frequency (at beginning of pulse)
BW: Pulse bandwidth (at beginning of pulse)
DUR: Pulse duration in TMR_PULSE cycles. The pulse duration value is given by $t_{off}-t_{on}$, where $t_{off}$ and $t_{on}$ denote the TMR_TSTMP values latched at the FFT_START pulse associated with the first and last FFT of a detected pulse, respectively.
TIMEON: Timestamp for start of pulse event. TIMEON contains the TMR_TSTMP value latched at the FFT_START pulse associated with the first FFT that produces a pulse detection match.
UCMCNT: Counter values from an associated universal clock module (UCM, described hereinafter) in the USS. The low-order 16 bits contain the UCM down counter value at the beginning of the pulse event. The least-significant 2 bits in the upper half-word contain the mod(N) counter value (also in the associated UCM) at the beginning of the pulse event. If there is no associated UCM with a pulse detector, this field is set to all zeros.
PWR: Pulse power estimate (at beginning of pulse, 1 dBm)

The signal detector 200 outputs descriptions of detected pulses as pulse events, containing the data described in the table above for example, into a circular list called the pulse event list in the DPR 500. A single list is used by all of the pulse detectors. The source pulse detector of an individual pulse event in the list is indicated by the pulse event "SDID" field.

Figure 9:
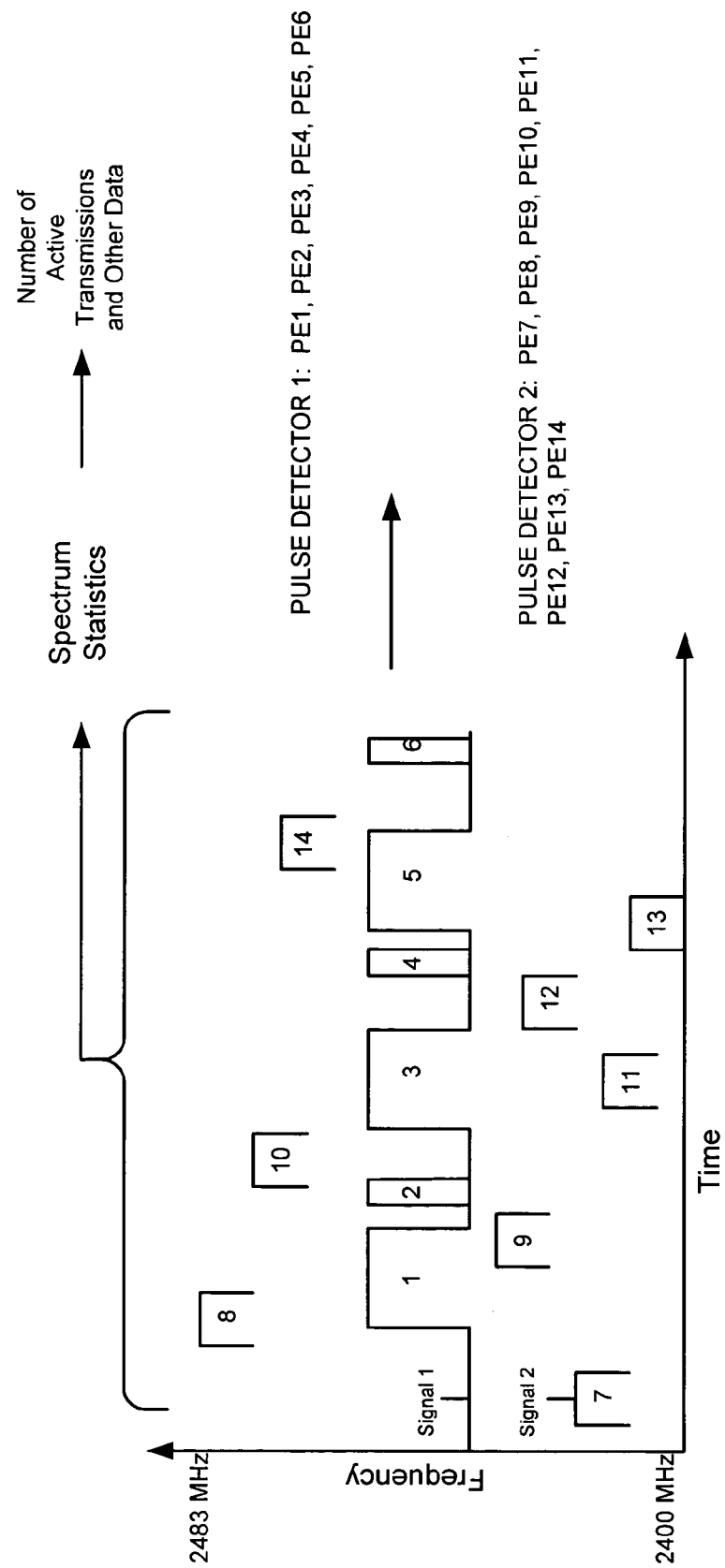
FIG. 9 is a graphical plot showing exemplary signal pulses and pulse event information generated by the signal detector for the exemplary signal pulses.

FIG. 9 illustrates exemplary signals and the corresponding pulse event data. There is IEEE 802.11b signal activity consisting of pulses 1–6. Pulses 1, 3 and 5 are the forward channel 802.11b transmissions and pulses 2, 4 and 6 are acknowledgement signals. There is also a frequency hopping signal, such as a Bluetooth™ SCO signal comprising pulses 7–14. The timing, strength and duration of the signals are not shown at precise scale.

Two pulse detectors are configured in a device where it is expected that an 802.11b signal and a frequency hopping signal would occur. A first pulse detector is configured to detect signals, such as the 802.11 signals, and would have the following parameters:

| | |
|---|---|
| Pulse Bandwidth: | 10 to 20 MHz |
| Center Frequency: | 36–38 MHz (To cover channel 6–2437 MHz) |
| Pulse Duration: | 70 microsec to 20 msec |
| Power: | −30 dBm to −80 dBm |

It is possible that the first pulse detector could be configured to detect a pulse on any frequency, but through prior general knowledge that can be acquired by looking at the spectrum statistics, it is possible to determine that an 802.11 signal pulse is occurring at a particular frequency in the frequency band.

A second pulse detector is configured to detect signals such as the frequency hopping signal and would have, for example, the following parameters:

| | |
|---|---|
| Pulse Bandwidth: | less than 2 MHz |
| Center Frequency: | 0 to 83 MHz (i.e., anywhere in the 2.4 GHz band) |
| Pulse Duration: | Up to 1 msec |
| Power: | −50 dBm to −75 dBm |

Exemplary pulse event data for these pulses are listed below. For simplicity, the time-on data associated with these pulses is omitted.

| | Pulse 1 |
|---|---|
| SDID: | 1 (identifying pulse detector 1) |
| Pulse Bandwidth: | 11 MHz |
| Center Frequency: | 37 MHz |
| Pulse Duration: | 1.1 msec |
| Power: | −75 dBm |
| | Pulse 2 |
| SDID: | 1 |
| Pulse Bandwidth: | 11 MHz |
| Center Frequency: | 37 MHz |
| Pulse Duration: | 200 microsec |
| Power: | −60 dBm |
| | Pulse 3 |
| SDID: | 1 |
| Pulse Bandwidth: | 12 MHz |
| Center Frequency: | 37 MHz |
| Pulse Duration: | 1.1 msec |
| Power: | −75 dBm |
| | Pulse 4 |
| SDID: | 1 |
| Pulse Bandwidth: | 11 MHz |
| Center Frequency: | 37 MHz |
| Pulse Duration: | 200 microsec |
| Power: | −60 dBm |
| | Pulse 5 |
| SDID: | 1 |
| Pulse Bandwidth: | 13 MHz |
| Center Frequency: | 37 MHz |
| Pulse Duration: | 18 msec |
| Power: | −75 dBm |
| | Pulse 6 |
| SDID: | 1 |
| Pulse Bandwidth: | 11 MHz |
| Center Frequency: | 37 MHz |
| Pulse Duration: | 200 microsec |
| Power: | −60 dBm |

The pulse event data for pulses 7–14 are very similar to each other, with the exception of the center frequency. For example, pulses 7–14 may have a pulse bandwidth of 1 MHz, a pulse duration of 350 microsec, whereas the center frequency will vary across nearly all of the 2400 MHz to 2483 MHz frequency band. The SDID for pulses 7–14 is 2, since pulse detector 2 is configured to detect these types of pulses.

There are other signal detector functions. One or more pulse detectors in the signal detector 200 may be configured to monitor pulse activity and the signal detector 200 may send a snapshot buffer trigger signal (SD_SBEVT) to the snapshot buffer 300 when a pulse event occurs corresponding to a configured pulse detector. The signal detector will monitor all pulse detectors and if any one of them detects such an event, the snapshot trigger signal SD_SBEVT is generated, either on the rising edge or falling edge of the detected pulse. The snapshot buffer trigger signal SD_SBEVT will cause the snapshot buffer 300 to capture samples of the DataI and DataQ signals, as described hereinafter.

Similarly, the signal detector may be configured to monitor activity on each pulse detector and send a spectrum analyzer trigger signal (SD_SAEVT) to the spectrum analyzer 100 (presumed to be in the transitional mode) when a desired pulse event is detected by any one of the pulse detectors. Again, this spectrum analyzer trigger signal is generated either on the rising edge or falling edge of the detected pulse. The SD_SAEVT signal is coupled to the SA memory controller 190 which will output to the DPR 500 samples (snapshots) of the PDB(k) data fields.

Figure 10:
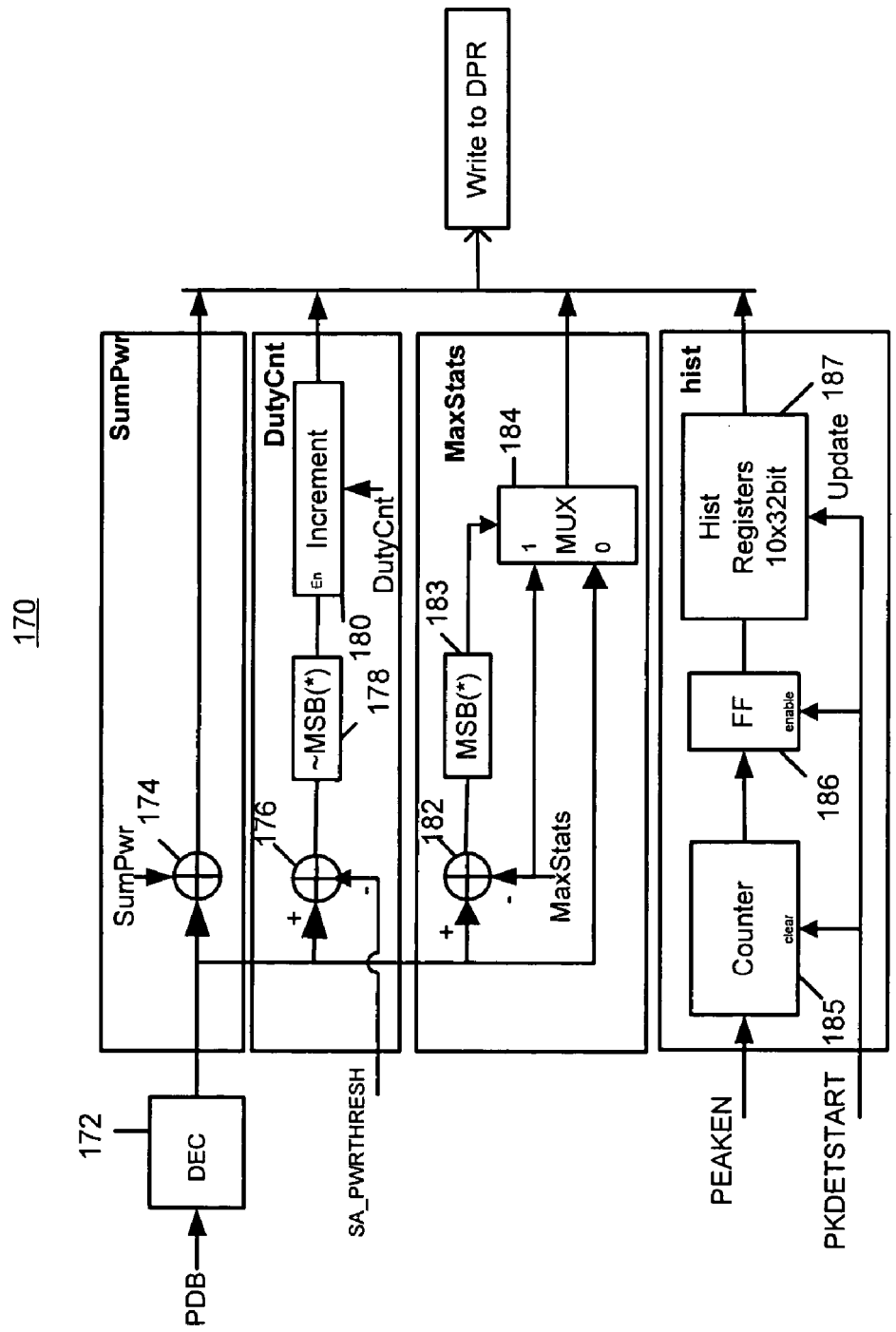
FIG. 10 is a schematic diagram of the stats module of the spectrum analyzer component of the SAGE.
Figure 11:
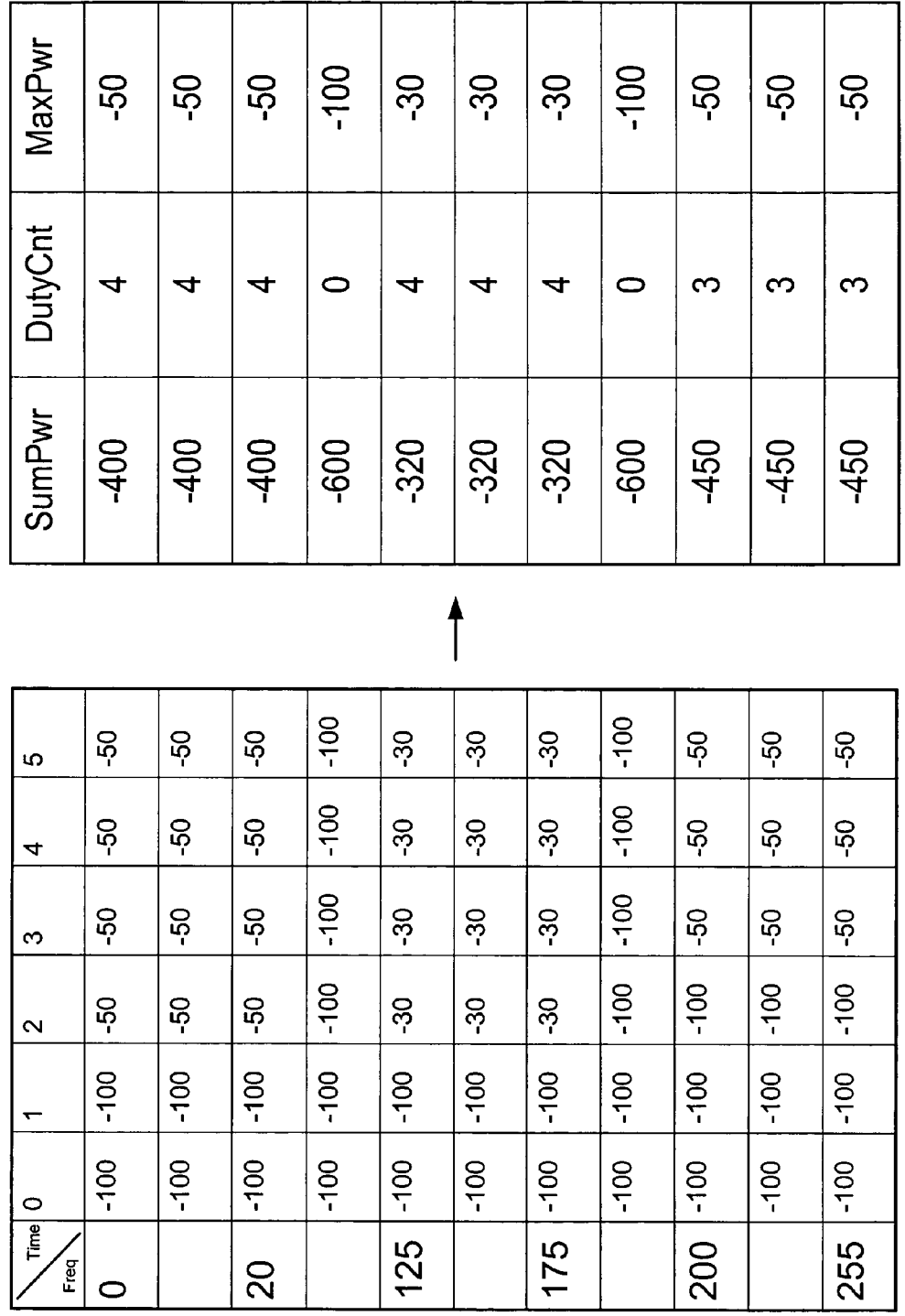
FIG. 11 is a diagram showing exemplary stats that are accumulated by the stats logic module.

Turning to FIGS. 10–12, the stats logic block 170 has modules to accumulate statistics for power, duty cycle, maximum power and a peaks histogram. Statistics are accumulated in the DPR over successive FFT time intervals. After a certain number of FFT intervals, determined by a configurable value stored in the spectrum analyzer control registers, an interrupt is generated to the MCU so that the MCU reads out the stats from the DPR into its memory. For example, the stats are maintained in the DPR for 10,000 FFT intervals before the MCU reads out the values from the DPR.

FIG. 11 illustrates an example of stats that are accumulated by the stats logic module shown in FIG. 10. The table on the left side of FIG. 11 illustrates dB power values for exemplary frequencies during time intervals t=0 through 5. The table on the right represents values updated in the DPR for the SumPwr, DutyCnt and MaxPwr statistics at those frequencies. In this example, the peak threshold is −50, and it is assumed that there are essentially three peaks: a first from frequency bin 0 to frequency bin 20; a second from frequency bin 125 to frequency bin 175; and a third from frequency bin 200 to frequency bin 255. All other frequency bins are assumed to be at −100 dB. Though not shown as such, the SumPwr statistic may be averaged by the MCU or another processor, and the DutyCnt may be converted to a percentage number.

To accumulate power stats, the PDB(k) data field is supplied to the stats logic block 170. It may be decimated by an optional decimator 172. The power at each frequency bin for a previous time interval is added by the adder 174 to the power at that frequency bin for the current time interval. The running power sum at each frequency bin is output to the DPR 500 as a SumPwr stat.

A duty count stat is generated by comparing the PDB at each frequency bin k with a power threshold (SA_PWRTHRESH) at the adder 176 and MSB block 178. Each time the power at a frequency bin exceeds the power threshold, the previous duty count statistic for that frequency bin is incremented by the increment block 180. The output of the increment block 180 is the duty count stat (DutyCnt), which again, is a running count of the number of times the power at a FFT frequency exceeds the power threshold.

A maximum power stat (MaxPwr) is tracked at each frequency bin. The current maximum power value at each frequency k is compared to the new power value at each frequency k by the adder 182 and MSB block 183. The multiplexer 184 selects for output either the current power maximum or the new PDB(k), depending on whether the new PDB(k) exceeds the current power maximum at the frequency.

The number of peaks that are detected by the peak detector during each FFT time interval is counted by the counter 185, buffered in the flip-flop (FF) 186 and stored in the histogram registers 187 for output to the DPR 500. The PEAKEN signal is the output of the peak detector that goes high when a peak is detected. The PKDETSTART signal restarts the counting process for a statistic update cycle.

FIG. 12 shows exemplary content of the histogram registers 187 including a running count of the number of time intervals (i.e., stats update cycles) that have 0 peaks, 1 peak, 2 peaks, . . . up to 9 peaks. This histogram is useful to estimate the number of different devices or networks operating simultaneously at different frequencies in the frequency band. As shown in FIG. 12, up until stats update cycle 5, there are two with no peaks, one stats update cycle with one peak and three stats update cycles with three peaks.

The Snapshot Buffer

The snapshot buffer 300 is a flexible data storage and triggering mechanism used to collect a set of raw ADC samples (DataI and DataQ or DataI' and DataQ', FIG. 2) for post-processing by the MCU 700. When a snapshot trigger condition is detected, the snapshot buffer 300 buffers up a set of ADC samples and asserts an interrupt to the MCU 700. The MCU 700 may then perform background-level processing on the ADC samples for the purposes of identifying or locating another device operating in the frequency band, or these samples may be passed to a different processor at for processing.

In a pre-store mode, the snapshot buffer 300 writes continuously to the DPR 500 and stops writing and interrupts the MCU when a snapshot trigger signal is detected. In a post-store mode, the DPR write operation begins only after a trigger is detected. A combination pre and post store scenario may be created (using the DELAYSTART and DELAYEND control registers) to capture samples of the receive data signals both before and after a snapshot trigger condition.

There are two types of snapshot trigger signals supported: SB_TRIG and SD_SBEVT. The snapshot trigger signal SD_SBEVT is sourced from the signal detector 200 as described above, and the SB_TRIG signal is sourced from a module external to the SAGE 10, such as a location measurement module. For example, the MCU 700 may be programmed to collect raw ADC samples when a particular signal pulse is detected for signal classification processes. The MCU 700 configures a pulse detector to generate the snapshot trigger signal SD_SBEVT upon detecting a pulse that meets a certain set of characteristics, as described above. The snapshot buffer 300 clears this bit when it has finished its processing (usually within one clock).

The snapshot buffer 300 samples may be stored in a variety of formats. One example of a format is one complex sample per 32-bit word. The high-order 16 bits contain the real part of the sample; the low-order 16-bits contain the imaginary part. The real and imaginary parts may be stored in a Q15 format, where 0 represents 0V on the ADC in the RF Interface 800, and 0x7FFF and 0x8000 represent positive and negative full-scale, respectively. A B-bit QN fractional number x takes on the values $\{n/2^N, n=-2^{B-1}, \ldots, 2^{B-1}-1\}$. The B-bit signed integer $n=2^N \cdot x$ is used to represent x and is usually stored as a signed, two's complement integer.

Examples of the control registers (and what they do) for the snapshot buffer are described below.

DELAYSTART: Number of samples to wait after the SB_TRIG signal before starting to write into DPR. Only valid if CNTRL.PRESTORE=0.

DELAYEND: Number of samples to write into DPR before DPR writes are disabled and a "snapshot complete" interrupt is posted to the MCU.

The count begins (1) when a trigger condition is asserted in prestore mode, or (2) DELAYSTART samples after a trigger condition in poststore mode.

STARTADDR: Address in DPR of first word of snapshot buffer.

ENDADDR: Address in DPR of last word of snapshot buffer.

WADDR: Starting write address into snapshot buffer (STARTADDR<=WADDR<=ENDADDR). When writing to the snapshot buffer, WADDR is incremented and after a write to ENDADDR, WADDR wraps back to STARTADDR. After a snapshot operation is complete, MCU may use this register to determine the address of the most recent write into the DPR.

TSTMP: Contains the TMR_TSTMP value latched immediately after the most recent snapshot trigger condition was asserted.

The control register includes the fields described below.

PRESTORE: Trigger prestore mode select. 1=Prestore mode (samples are written continuously to DPR while SB looks for a trigger signal) 0=Poststore mode (samples written to DPR DELAY_START samples after trigger detected).

REP: Repetition mode select. 1=Continuous mode—After a trigger signal is detected, immediately start looking for next trigger and continue writing to DPR if prestore mode enabled. STATUS always reads 1 in this mode. 0=One shot mode—Perform one snapshot buffering operation (during which STATUS will set to 1) and set STATUS to zero when done.

GO: Begin snapshot buffering operation. When GO is set to 0, SB is idle and does not look for a trigger. When the MCU sets GO to 1, SB starts looking for a trigger signal and prestoring samples in DPR (only if PRESTORE set to 1).

STATUS: Status field. 00=SB in idle state due to GO=0.01=Waiting for trigger. Always set to 1 in continuous mode. 10=SB_TRIG detected in one shot mode and snapshot buffering operation complete. 11=SD_SBEVT detected in one shot mode and snapshot buffering operation complete. The SDID field indicates which pulse detector (1–4) caused the trigger.

SDID: Indicates which pulse detector caused the trigger condition.

The Dual Port RAM

The DPR 500 will be described with reference to FIGS. 13–16.

Figure 13:
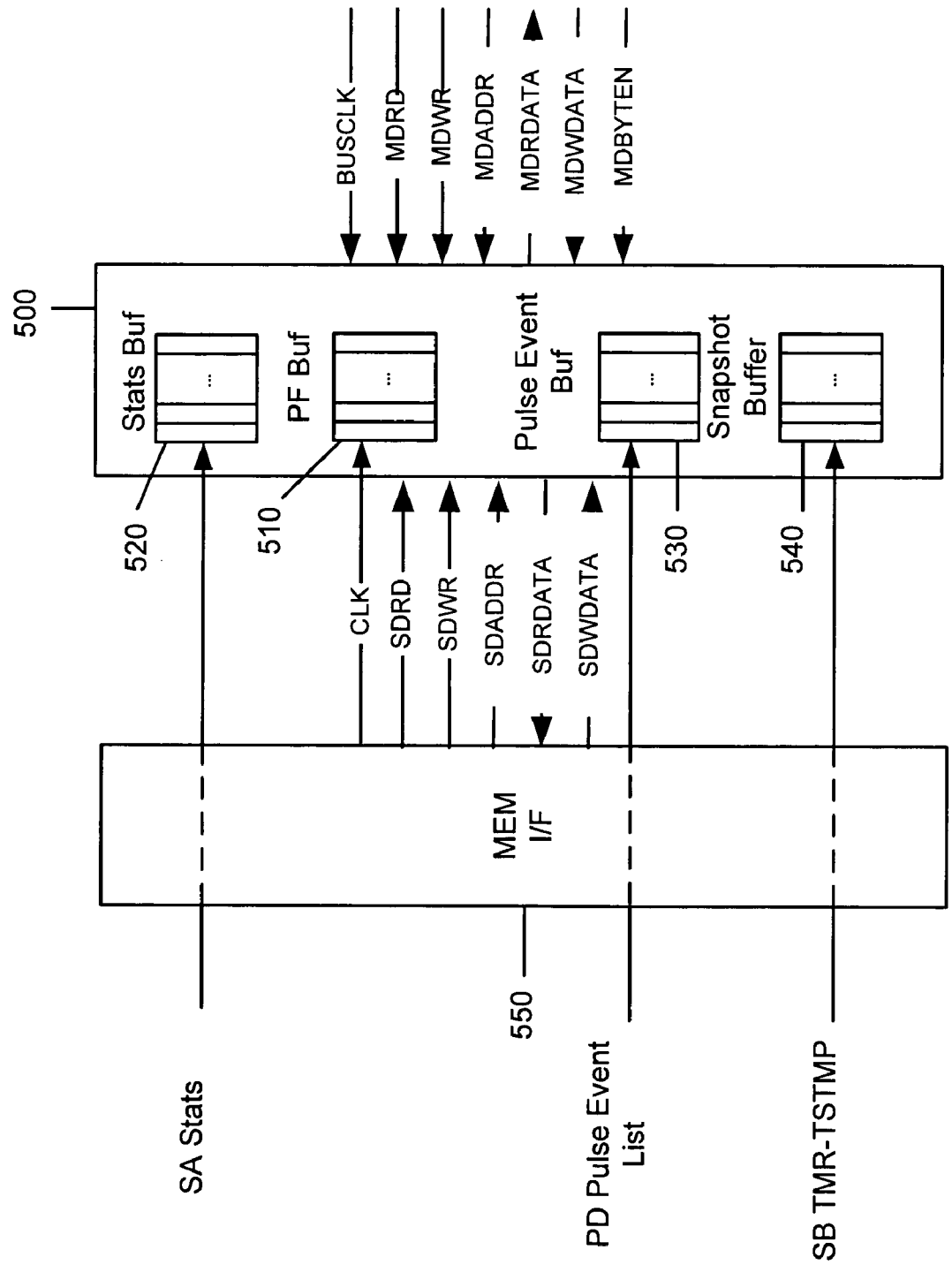
FIG. 13 is a block diagram showing the dual port RAM (DPR) storage used to store data generated by the spectrum analysis engine, and from which a microprocessor control unit (MCU) may obtain output of the SAGE.

Referring first to FIGS. 13 and 14, the DPR 500 is partitioned into several buffers or storage areas to store information generated by the spectrum analyzer 100, signal detector 200 and snapshot buffer 300. A power vs. frequency circular buffer (PF Buf) 510 stores real-time power vs. frequency information output by the spectrum analyzer 100. The table on the left in FIG. 11 generally resembles the PF Buffer 510. A stats buffer 520 stores SumPwr, DutyCnt, MaxPwr and peaks statistics output by stats logic module. FIGS. 11 and 12 show represented data that is stored by the stats buffer 520. A pulse event circular buffer 530 stores pulse event data output by the signal detector 200 and a snapshot circular buffer 540 stores raw ADC samples from the snapshot buffer 300. Information is exchanged between elements of the SAGE 10 and the DPR 500 via the RAM interface (I/F) 550.

The DPR 500 is, for example, a 32-bit wide, synchronous DPR. Different clocks are used to drive the logic at each port. The CLK signal is used on SAGE components side and the BUSCLK signal is used on the MCU side. The DPR 500 is word addressable from the SAGE side and byte addressable from the MCU side. An AHB bus interface maps an internal MCU byte address into the corresponding word addresses (MDADDR) and byte enable (MDBYTEN) signals attached to the MCU side of the DPR.

The data structures used to manage the DPR buffers 510–540 are stored in the control registers associated with DPR. The MCU 700 is responsible for configuring the addresses and relative sizes of each buffer using these control registers after reset.

Figure 16:
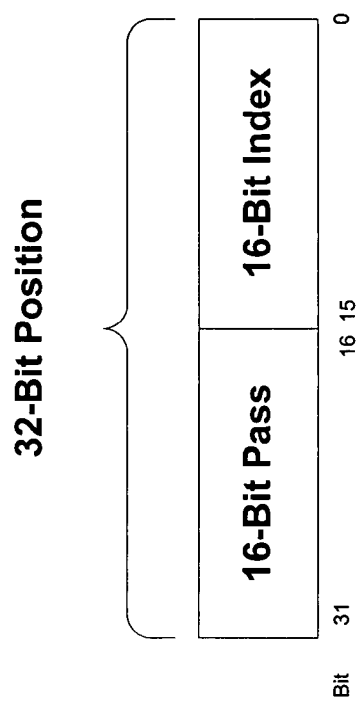
FIG. 16 is a diagram showing the position list format of the circular list for data stored in the DPR.
Figure 15:
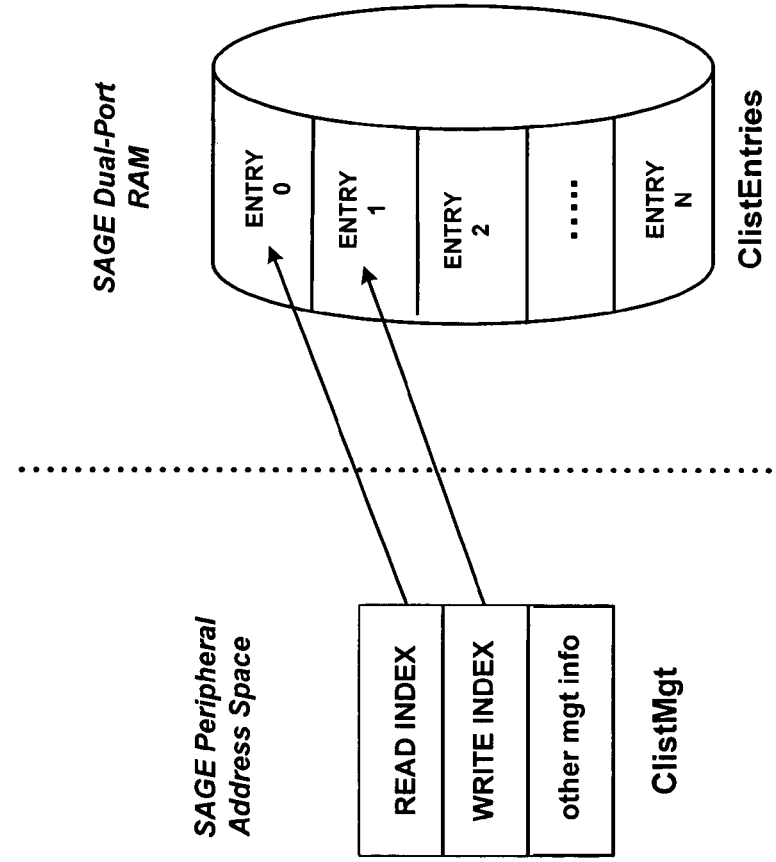
FIG. 15 is a diagram showing the circular list structure of the data stored in the DPR.

Referring to FIGS. 15 and 16, the SAGE 10 uses circular lists to manage some of the data stored in the DPR 500. As indicated above, buffers 510, 530 and 540 use circular lists. A circular list (Clist) consists of a list of fixed sized entries (ClistEntries) and a management structure (ClistMgt). The ClistEntries portion of the list is stored in the DPR 500. Each Clist has an associated ClistMgt structure which resides within the peripheral address space. The DPR location of the ClistEntries is held within ClistMgt. The entry size (ClistMgt.sizeofEntry) of the list is configurable. The Clist is essentially a circular buffer, i.e., a first-in-first-out (FIFO) buffer.

When performing input/output with a circular list, read and write indices are maintained to indicate the next entry to be read or written. Whenever the end of the list is reached the index is wrapped back to the starting position (i.e., circular list). Whenever a read or write index is wrapped to the starting position, a corresponding read pass number or write pass number is incremented. This combination of index and pass number is called a "position" or ClistPosition. The ClistPosition is, for example, a 32-bit quantity consisting of a 16-bit "pass" and a 16-bit "index." When the pass number is updated, the entire 32-bit ClistPosition is written out as a single "atomic" operation. Similarly, a read operation reads the entire 32-bit ClistPosition to ensure the pass number and index components are consistent when wrap occurs.

The Universal Signal Synchronizer

The universal signal synchronizer 400 is useful to lock to interfering periodic signal sources. The USS 400 consists of multiple programmable clock generators referred to as USS clock modules (UCMs) 410. The MCU 700 can detect interference from a periodic signal source such as a Bluetooth™ headset, a cordless phone, etc., by examining traffic statistics gathered by the host communication device. For example, the MAC logic 750 will accumulate traffic statistics indicating how successful the host communication device has been in transmitting to and receiving information from other devices according to a MAC protocol, such as IEEE 802.11x, employed by the device. Traffic statistics that may reveal the presence of an interferer are: (1) un-acknowledged messages; (2) repeated cyclic redundancy code (CRC) errors; (3) low received signal strength, etc. For example, the fact that several messages are sent from the device that are not acknowledged by the intended destination device is very revealing of interference in the frequency band.

When the MCU determines to look for the cause of the interference, it configures the appropriate frequency and phase parameters corresponding to the interference source into a UCM 410, and, using pulse timing information from the signal detector 200, phase/frequency locks the UCM timing to the transmit timing for the interference source. After phase/frequency lock has taken place, the UCM can be used as a timing reference to prevent data transmissions to/from the MAC logic 750 (FIG. 1) from overlapping and interfering with data exchanges with the interference source.

Figure 17:
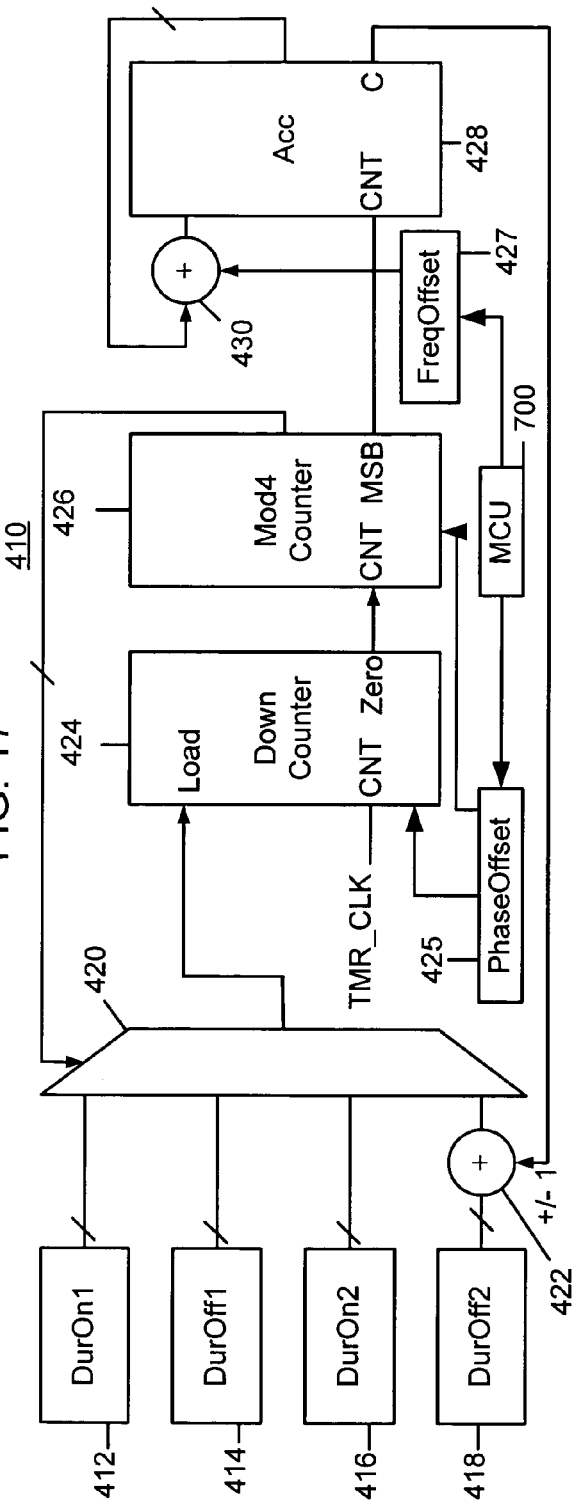
FIG. 17 is a block diagram of a universal clock module component of the universal signal synchronizer.
Figure 18:
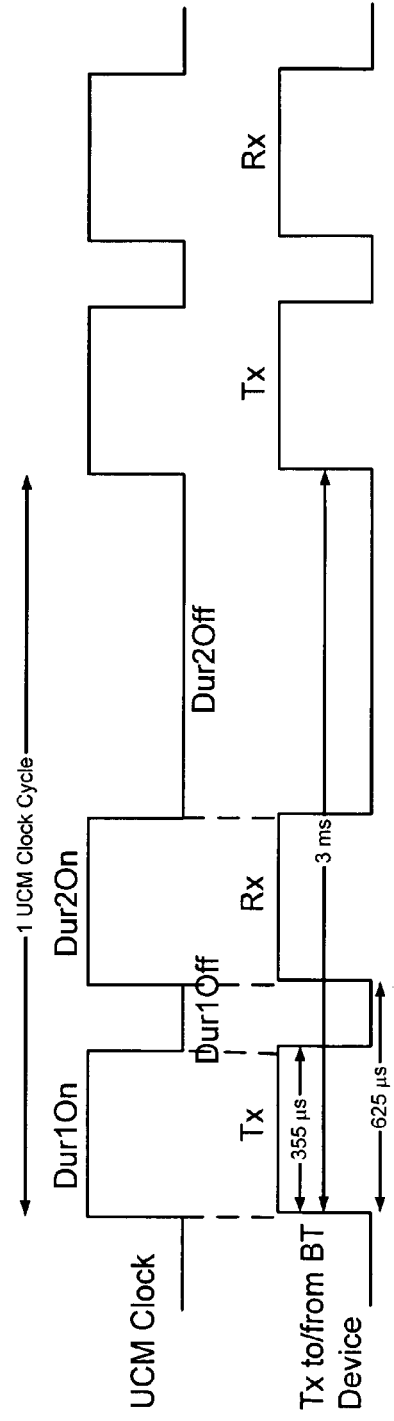
FIG. 18 is a timing diagram showing how a universal clock module is used to synchronize to an exemplary pulse detected in the frequency band.

A block diagram of a UCM 410 is shown in FIG. 17. A timing diagram for an exemplary interferer, such as a Bluetooth™ signal, is shown in FIG. 18. Each UCM clock interval consists of two on/off segments (on=logic 1, off=logic 0), the duration of which is specified by the DurOn1, DurOff1, DurOn2, and DurOff2 registers 412, 414, 416 and 418, respectively. The two segment UCM clock scheme is used to accommodate interference sources such as Bluetooth SCO links that exchange bidirectional data using two unequally-spaced pulses, as shown in FIG. 18. A multiplexer 420 selects input from one of the registers 412 through 418, where selection from register 418 is via an adder 422 coupled between the register 418 and an input to the multiplexer 420.

A down counter 424 is connected to the output of the multiplexer 420 and counts down from the duration of each duration segment. A mod(N) counter 426 is connected to the down counter 424 and is used to reload the down counter 424 with the duration of the next segment after the down counter 424 counts down to zero. For the case shown, the mod(N) counter 426 is a mod4 counter. An accumulator 428 is coupled to the mod4 counter 424 and has a carry output that is coupled back to the adder 422. The most significant bit (MSB) output of the mod4 counter 426 is used to drive the count input of the accumulator 428. The accumulator 428 is a Z bit accumulator used to offset the UCM clock frequency, advancing or delaying the UCM clock by one TMR_CLK cycle every $2^Z$/freqOffset UCM cycles, where the freqOffset parameter is configurable by the MCU via an adder 430 coupled to the accumulator 428. There is a phaseOffset register 425 and a freqOffset register 427 that the MCU writes to for the purposes explained hereinafter.

In general, the clock module comprises at least N registers, each of which stores a programmable duration value associated with one of two states of a pulse of the communication signal, where N is equal to 2 times the number of pulses in a cycle of the communication signal, and the mod(N) counter coupled to the down counter counts up to N−1 by one in response to the down counter reaching zero and when reaching N−1, causing content of the next of the N registers to be loaded into the down counter. The count input of the Z-bit accumulator 428 is coupled to an output of the mod(N) counter, and the adder 430 adds an output of the accumulator 428 with the frequency offset value and supplies the sum to an input of the accumulator, wherein a carry output of the accumulator is coupled to the Nth register to increment or decrement the value of the Nth register before it is loaded into the counter, thereby extending or contracting the length of a cycle of the clock signal used to drive the down counter by one clock pulse every $2^Z$/(frequency offset value) clock cycles.

A UCM TMR_CLK frequency of $f_{TMR\_CLK}=2$ MHz provides sub-microsecond timing granularity on the pulse duration intervals. An 18-bit register size for the duration registers 412–418 accommodates transmission frequencies as low as 10 Hz. A 16-bit (Z=16) accumulator is suitable for the accumulator 428 to provide less than 0.01 ppm frequency resolution for a UCM clock frequency of 1 kHz. The following additional characteristics may apply to the UCM 410 shown in FIG. 17:

Output frequency=$f_{CLK}/[(M+\text{freqOffset})/2^{16}] \approx f_{CLK}/M\{1-(\text{freqOffset}/M2^{16})\}$ Hz, where $M$=DurOn1+DurOff1+DurOn2+DurOff2.

Frequency Resolution≈$f_{CLK}/(M^2 2^{16})$ Hz=$10^6/(M^2 2^{16})$

Output clock frequency range: 1.9 Hz (DurOn1=DurOff1=DurOn2=DurOff2=$2^{18}$−1) to 500 kHz (DurOn1=DurOff1=DurOn2=DurOff2=1)

When the MCU 700 detects and classifies a periodic interference source, it takes the following steps to lock the UCM timing to the transmission timing associated with the interference source.

First, the MCU initializes and configures a UCM 410 to the appropriate (nominal) frequency using the DurOn and DurOff registers and it sets the content of the freqOffset register 425 to zero. The MCU writes values to the duration registers based on knowledge gained about the interferer from pulse events output by a pulse detector 220 (FIG. 3) and/or from snapshot buffer data supplied to the MCU that lead to the MCU determine that there is an interference event. The MCU also associates a pulse detector with the UCM 410 and configures the pulse detector to measure the phase offset between the interference source and the UCM 410. During the synchronization process, information about the timing of the interferer signal is obtained from pulse events generated by the assigned pulse detector, and the MCU compares them against the duration values written into the duration registers. The pulse events include the count values of the down counter and the mod(N) counter at the detection of a pulse, as described above in connection with the description of the signal detector.

The MCU examines the count values of the down counter and the mod(N) counter to measure a phase error between the clock signal that drives the down counter and the occurrence of the pulse of the communication signal. The MCU removes the initial phase offset/error between the UCM 410 and the interference source by loading a phase adjustment value into the PhaseOffset register 425. This causes the UCM 410 to retard the phase by the value specified in the PhaseOffset register 425 the next time the down counter 424 and mod4 counter 426 cycle to zero.

Figure 19:
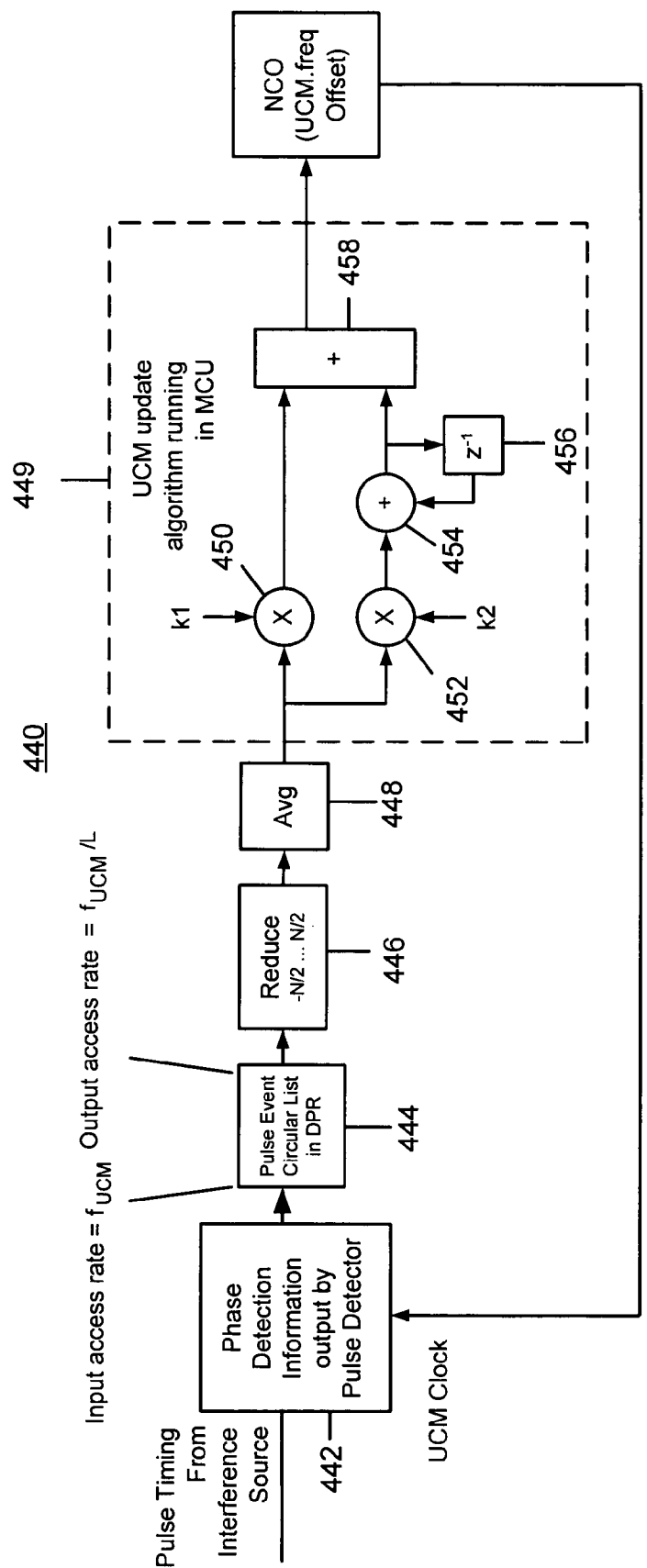
FIG. 19 is a block diagram of a clock update process to update the frequency offset between the clock of a detected signal and a local clock.

After removing the initial phase offset, the MCU periodically monitors the phase count values of the down counter and the mod(N) counter in the pulse event data to measure the phase error. The MCU generates a frequency offset between the interference source (from the pulse detector) and the UCM clock and updates the FreqOffset register 427 to compensate for frequency drift between the two signals. A block diagram of an update technique using a second order phase lock loop (PLL) is shown in FIG. 19, which will be described hereinafter. The MCU writes a value into the FreqOffset register that causes the accumulator 428 to retard or advance (depending on the sign of the adder 422) the frequency a certain number of times per UCM clock cycles.

When the phase offset samples converge to zero, the UCM is said to be phase/frequency locked to the interference source. Once the loop is locked, the MCU may let the UCM clock "flywheel" for a period of time without monitoring the phase offset from the interference source. The MCU may continue to periodically monitor the phase offset and update the loop parameters since the clocks will eventually drift (primarily due to temperature changes in the near and far end reference oscillators). A good rule of thumb to use for estimating the drift rate in this case is ½ microsecond per second, assuming an oscillator with +/−20 ppm of variation over 70 degrees C. (4/7 ppm per degree C.), and 3 degrees F=1.7 degrees C. temperature variation over 5 minutes (due to air conditioner hysteresis, etc.).

Reference is now made to FIG. 19, which shows a process 440 useful by the MCU to update for clock drifts. The process 440 updates the frequency offset between the clock of the interfering signal and the local clock operating the UCM. Step 442 represents the pulse detector 220, associated with the particular interfering signal, generating phase information by reading the states of down counter 424 and mod(N) counter 426, and step 444 represents retrieving of information from the pulse event circular list in the pulse event buffer 530 of the DPR 500. Multiple pulse events from the signal detector 200 may be buffered up in the DPR 500 before the MCU has time to retrieve them. Next, in step 446, the phase detection information is updated depending on the value of the down counter 424 relative to the value of the DurOn1 register 412. If the down counter value 424 is less than the value of DurOne1 divided by 2, then the phase detection information is set equal to the value of the down counter 424. Otherwise, the phase detector information is set equal to the value of the down counter 424 less the value of the DurOn1 register 412. In step 448, output of step 446 is averaged to reduce noise effects. Next, a filter or phase-lock-loop (PLL) process 449 is performed to lock to the phase and frequency of the interfering signal clock. Any suitable first-order or second-order filtering or PLL process can be used. FIG. 19 shows a second order PLL process comprising two scaling operations 450 and 452, an adder 454, a $z^{-1}$ block 456 and an accumulator 458. The parameters k1 and k2 are PLL constants that depend on the UCM clock rate and a buffering factor of the pulse event circular list in the DPR. The output of the process 440 is a frequency offset value that is stored for later use in synchronizing to the near clock and the far-end clock (that of the particular interfering signal). Once the frequency offset value is computed, the interfering signal can be ignored for a period of time, and the UCM can more quickly lock to the interfering signal by loading the stored frequency offset (FreqOffset) into the FreqOffset register 427 of the UCM as shown in FIG. 17.

Examples of the registers used to control and monitor a UCM 410 from the MCU are described below.

DURON1: Duration in TMR_PULSE cycles of first "on" interval of a UCM clock cycle. The MCU may update this value anytime (regardless of whether the UCM is enabled).

DUROFF1: Duration in TMR_PULSE cycles of first "off" interval of a UCM clock cycle. The MCU may update this value anytime (regardless of whether the UCM is enabled).

DURON2: Duration in TMR_PULSE cycles of second "on" interval of a UCM clock cycle. The MCU may update this value anytime (regardless of whether the UCM is enabled).

DUROFF2: Duration in TMR_PULSE cycles of second "off" interval of a UCM clock cycle. The MCU may update this value anytime (regardless of whether the UCM is enabled).

FREQOFFSET: Creates a frequency offset of $(F_{TMR\_PULSE} * \text{FREQOFFSET})/(M^2 * 2^{16})$ Hz relative to the nominal clock frequency ($F_{TMR\_PULSE}/M$) on the UCM clock. The CNTRL.FOFFSET bit specifies the sense of the offset. If CNTRL.FOFFSET=1, a positive frequency offset is applied, otherwise a negative frequency offset is applied (a positive frequency offset corresponds to a higher-than-nominal UCM clock frequency). The MCU may update this value anytime (regardless of whether the UCM is enabled).

PHASEOFFSET: Retards the phase of the UCM clock by PHASEOFFSET TMR_PULSE cycles by loading the value PHASEOFFSET into the Down Counter at the end of the next Dur1Off interval. The phase adjustment is made once each time the PHADJUST bit in the CNTRL register is set.

MINGAP: If the time between two consecutive interference events on the UCM signals specified by USS_SELECT is less than MINGAP TMR_PULSEs, the USS will merge the two events and report on them as if they were one interference event spanning both interference pulse durations.

DOWNCTR: Contents of UCM down counter register (updated once per TMR_PULSE)

The fields of the control register for a UCM are defined below.

ENABLE: UCM enable. Setting the ENABLE bit for 1 TMR_PULSE cycle causes the clock to start counting in the Dur1Off state. Clearing ENABLE for 1 or more TMR_PULSEs causes the UCM clock to stop counting.

PHADJUST: Writing a 1 to this bit causes the UCM to retard its clock phase by PHASEOFFSET TMR_PULSE cycles by loading the value PHASEOFFSET into the Down Counter at the end of the next Dur1Off clock segment. The UCM clears this bit after the phase change has taken place.

FOFFSET: Specifies whether a positive or negative frequency offset is to be applied using the FREQOFFSET field. 1=Positive frequency offset applied. 0=negative frequency offset applied MOD4CT: Contents of Modulo 4 counter The USS 400 passes UCM timing information to an external component, such as the MAC logic 750, using the NEXTINTFDUR and NEXTINTFTIME signals described hereinafter. The USS_SELECT signals, also described in the table above, allow for selection of which UCMs to include in next event calculation.

Other Interfaces to the SAGE

With reference to FIG. 1, other interfaces to the SAGE 10 will be described. The global timer interfaces (GTI) are used by the spectrum analyzer 100 and signal detector 200 to timestamp transmission events in the sampled frequency band. The GTI comprises, for example, the timestamp signal (TMR_TSTMP) and a global timer clock signal (TMR_PULSE), where TMR_PULSE=1 on the positive edge of BUSCLK indicates a new value of TMR_TSTMP. The GTI logic runs at the BUSCLK clock frequency. The TMR_TSTMP field is updated periodically, such as at 2 MHz, during BUSCLKs in which TMR_CLK=1.

The SAGE 10 communicates timing information for periodic interference sources (such as Bluetooth headsets or cordless phones) to another hardware element (external to the SAGE 10), such as the MAC logic 750. There are primarily three MAC interface signals, USS_SELECT, NEXTINTFDUR and NEXTINTFTIME. NEXTINTFDUR is the duration in TMR_PULSEs of the next interference event among the selected UCM clocks via USS_SELECT. The interference condition is said to be active (due to an interferer's transmission) when any of the selected UCM clocks is high. When all of the selected interference sources are inactive (i.e., all UCM clocks are low), NEXTINTFDUR indicates the duration of the next interference event in TMR_PULSEs. When at least one of the interference sources is active, NEXTINTFDUR indicates the time in TMR_PULSEs until the end of the current interference transmission, and is updated once per TMR_PULSE.

NEXTINTFTIME is the time remaining in TMR_PULSEs until the next interference event among the selected UCM clocks via USS_SELECT. The interference condition is said to be active (due to an interferer's transmission) when any of the selected UCM clocks is high. When all of the selected interference sources are inactive, NEXTINTFTIME indicates the time until the next interference event and is updated once per TMR_PULSE. When at least one of the interference sources is active, NEXTINTFTIME reads zero.

USS_SELECT is a signal that selects which USS UCMs 410 to include in the next interference event calculations, as reported to the MAC logic 750 through the NEXTINTFXXX signals. USS_SELECT[i]=1 means include UCM(i) in the calculation.

Examples of MCU interface signals are described below. Some of these signals are identified in FIGS. 1, 3 and 6.

ADDR: Control register word address

BUSCLK: Clock used to control the MCU side of the DPR, USS, Lower MAC and Global Timer interfaces:

IRQ: Level-triggered interrupt request to MCU. Whenever an enabled interrupt condition becomes active, SAGE 10 asserts an interrupt to the MCU by setting IRQ to 0. The MCU clears the interrupt by clearing the appropriate bits in the IF register. SAGE automatically sets IRQ to 1 when all active interrupt conditions have been cleared in the IF register.

MDADDR: DPR word address—MCU side

MDBYTEEN: DPR byte enable—MCU side

MDRD: DPR read strobe—MCU side

MDRDATA: DPR read data—MCU side

MDWR: DPR write strobe—MCU side

MDWDATA: DPR write data—MCU side

RD: Control register read strobe

RDATA: Control register read data

SDADDR: DPR word address—SAGE side

SDRD: DPR read strobe—SAGE side

SDRDATA: DPR read data—SAGE side

SDWR: DPR write strobe—SAGE side

SDWDATA: DPR write data—SAGE side

WR: Control register write strobe

WDATA: Control register write data

Operation and Uses of the SAGE

Figure 20:
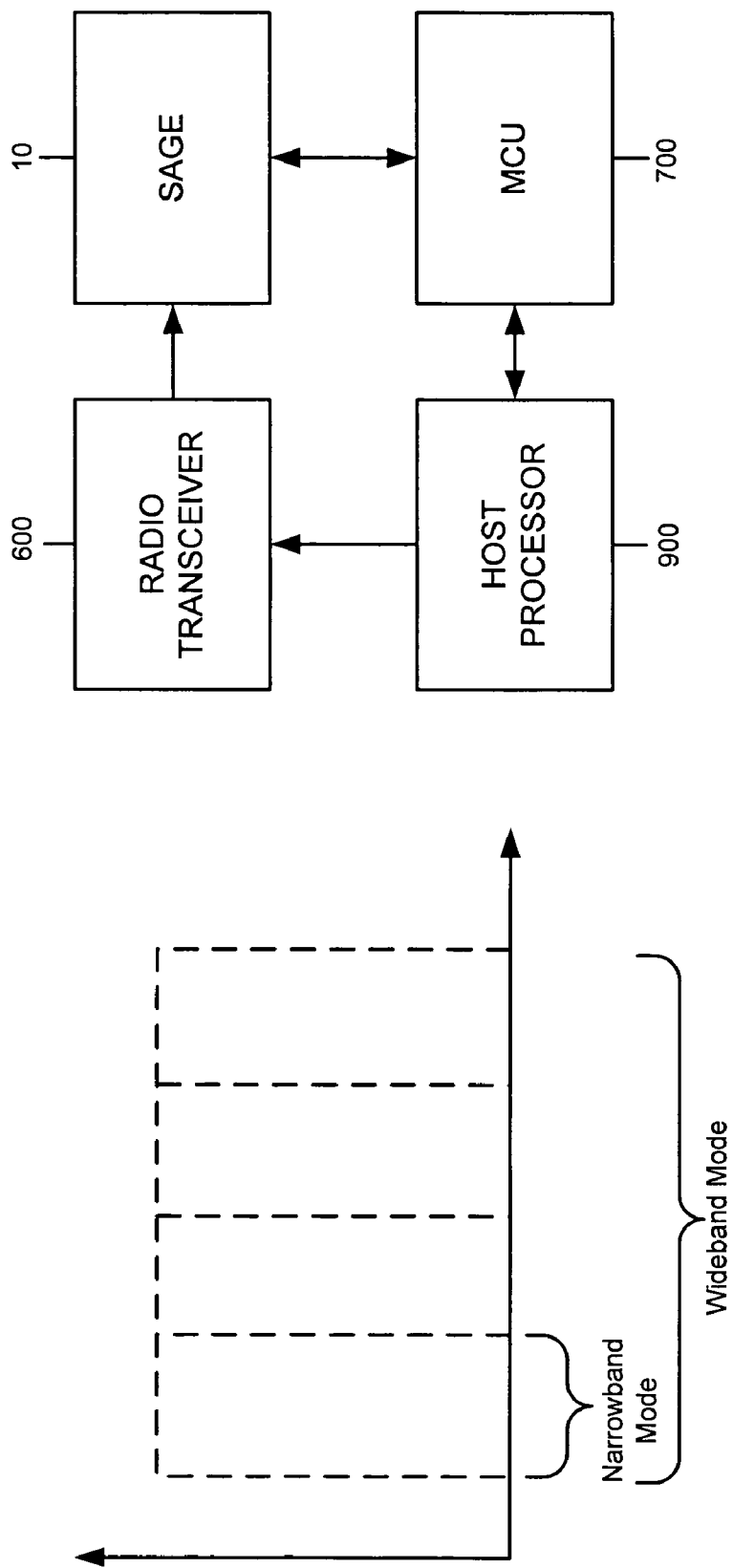
FIG. 20 is a diagram showing how the SAGE may be operated.

With reference to FIG. 20, one example of how the SAGE 10 may be operated is described. The SAGE 10 may reside in a communication device that comprises the radio transceiver 600 and a MCU 700. In addition, for higher level processing, a host processor 900 may also be provided that is coupled to the MCU 700. The MCU 700 and host processor 900 may share responsibility for configuring the SAGE 10 and the radio transceiver 600. The host processor 900 may be responsible for more complex functions. However, it should be understood that the functions of the MCU 700 and the host processor 900 may be executed by a single processor of suitable processing capability and power consumption characteristics. The radio transceiver 600 is shared by the SAGE 10 and other communication device functions, such as receiving signals from or transmitting signals to another communication device. The receiver of the radio transceiver 600 cannot be used by the SAGE 10 when the communication device is receiving a signal, and in some cases, the same is true when the communication device is transmitting a signal to another device.

There are many ways to employ the features and functions of the SAGE 10, some examples of which are explained. The MCU 700 or the host processor 900 may be programmed to configure the receiver portion of the radio transceiver 600 to operate in a wideband mode, thereby sampling activity in an entire frequency band for a time period, such as 100 msec or longer. In addition, the MCU 700 or host processor 900 may configure certain basic parameters of the SAGE 10, such as the decimator factor, the cycle count of the number of spectrum analyzer updates (i.e., FFT intervals) before forwarding the stats to the MCU 700, the minimum power threshold for duty counting, the lowpass filter parameter of the spectrum analyzer. The receiver portion of the radio transceiver 600 may also be configured to operate in a narrowband mode at a configurable center frequency.

While the radio transceiver 600 is operated in a wideband mode, the SAGE 10 is activated to "sniff" the spectrum with the spectrum analyzer component of the SAGE 10. The spectrum analyzer stats, such as those shown in FIGS. 11 and 12, are accumulated in the DPR and read by the MCU 700 and further processed by the host processor 900. During this sniff mode, the pulse detectors of the signal detector component may be configured in a default mode to look for signal pulses of commonly expected signals in the frequency band. In the case of an unlicensed frequency band, such signals may include an IEEE 802.11 signal, a cordless phone signal, or a Bluetooth™ frequency hopping signal. Alternatively, during the sniff mode the output of the pulse detectors may be completed ignored and the spectrum analyzer stats processed to determine generally what is happening in the frequency band. Based on intelligence gathered by the spectrum analyzer stats generated from the sniff mode, the host processor 900 or MCU 700 may configure one or more pulse detectors of the SAGE 10 to look for certain types of signal pulses in the frequency band using the pulse detector configuration parameters described above.

Still another possibility is to iteratively change the configuration of one or more pulse detectors so as to cycle through pulse detector configurations over time. For example, the center frequency, bandwidth, pulse duration and/or time between pulses parameters can be changed to process incoming signal data. The incoming signals are processed during each cycle with the one or more pulse detectors. Eventually, by cycling through different pulse detector configurations, the goal is to eventually find a pulse detector configuration that fits the type of signal activity occurring in the frequency band. This is useful, for example, in a signal classification process.

Further operation of the SAGE to gather output from the signal detector may occur while the radio is in a wideband mode or a narrowband mode, depending on the demands of the radio for communication services and the type of signals suspected to be present in the frequency band. Whether configured based on information gathered from a sniff mode, or operated using predetermined configuration information, the pulse detectors will generate pulse event information that is output to the MCU 700, together with spectrum analyzer stats and any snapshot buffered data. In addition, the universal signal synchronizer component of the SAGE 10 may be operated by the MCU to synchronize to the clocks of potentially interfering communication signals in the frequency band. This synchronization information can be used in an interference mitigation or co-existence algorithm executed by the MCU 700 or the host processor 900 to schedule transmissions by the communication device so as to avoid collisions with other communication signals in the frequency band.

In addition, the output of the SAGE 10 can be used in a signal classification process to identify/classify signals in a frequency band, such as for example: a wireless headset operating with a frequency hopping communication protocol (e.g., Bluetooth™); wireless file/print services; radar systems; microwave ovens, an IEEE 802.11 wireless local area network; a HomeRF™ network; a FHSS cordless phone; an analog cordless phone; wireless infant/security monitors; devices operating using the IEEE 802.15.3 communication protocol. A signal classification process is disclosed in the aforementioned commonly assigned patent application.

Figure 21:
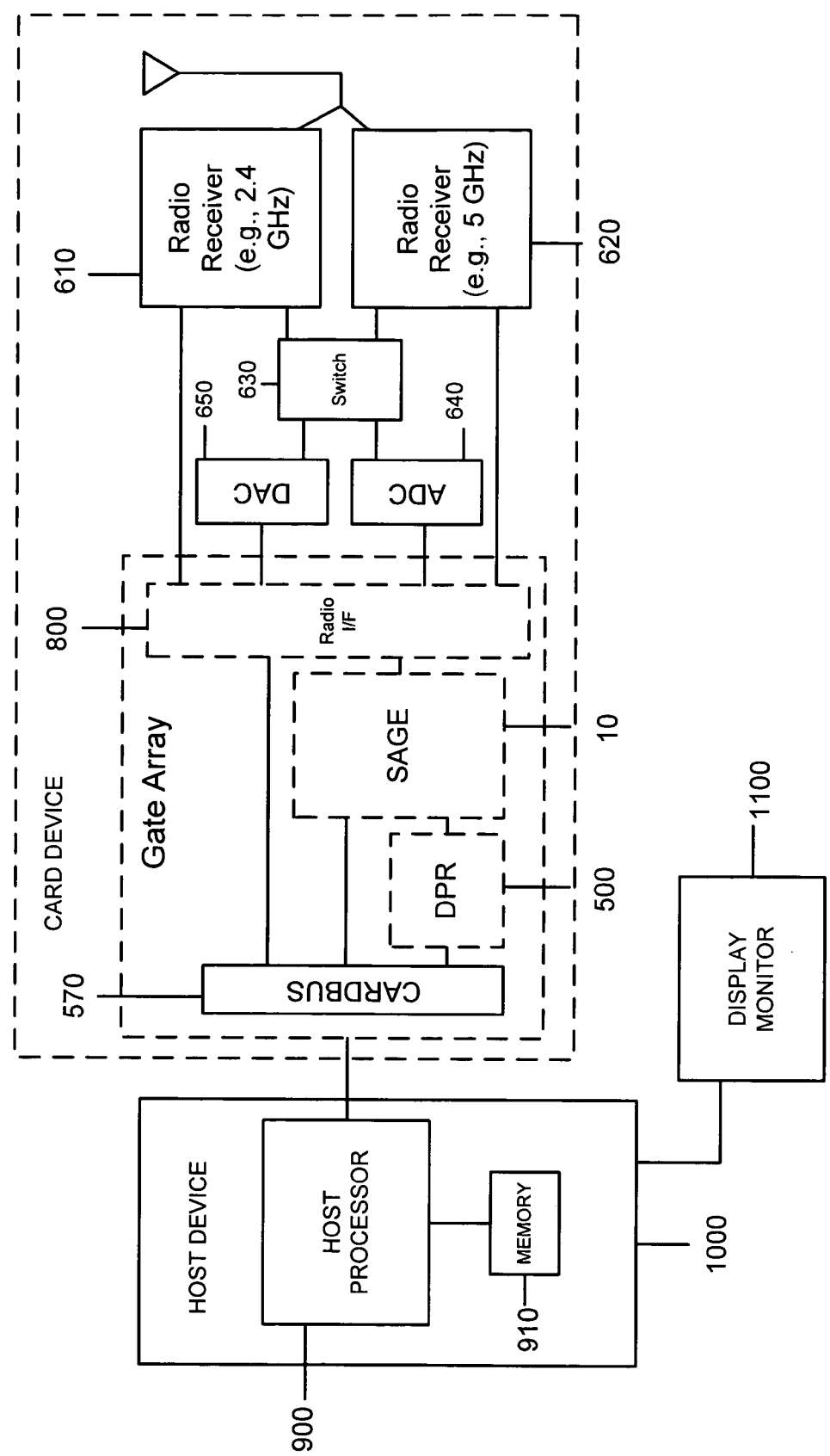
FIG. 21 is a block diagram showing another environment in which the SAGE may be deployed.

FIG. 21 illustrates another example of a use of the SAGE 10. In this example, the SAGE 10 is deployed together with the DPR 500 and radio I/F 800. These components may be implemented in a field programmable gate array together with a cardbus interface 570. The cardbus interface 570 may interface with various card-slot types, such as Type II PC-Card slot. The SAGE 10 is used by a host device 1000 that has a host processor 900 as well as other components. A display monitor 1100 may be coupled to the host device 1000. The host device 1000 may be, for example, an access point for a wireless local area network, in which case it would have the requisite radio transceiver and baseband signal processing components. Alternatively, the host device 1000 may be a desktop or notebook personal computer or personal digital assistant. A memory 910 in the host device may store a software programs for controlling the use of the SAGE 10 and one or application programs for using the output of the SAGE 10. In addition, the memory may store driver software for the host device, such as drivers for operating systems such as Windows operating systems (Windows® XP, Windows® CE, etc.).

One or more radio receivers may be coupled to the radio I/F 800. For example, one radio receiver 610 may be dedicated to one frequency band (such as the 2.4 GHz unlicensed band) and another radio receiver 620 may be dedicated to another frequency band (such as the 5 GHz unlicensed bands). Each radio receiver 600 and 610 may have the capability of operating in a wideband mode for purposes of downconverting energy in the entire frequency band for a time interval. An example of a radio receiver is identified above. A switch 630 selects the baseband analog output from one of the radio receivers, and couples it to an ADC 640, which is in turn coupled to the radio I/F 800. The DAC 650 is used to couple control signals to the radio receivers to, for example, control the bandwidth of operation of the radio receiver for wideband or narrowband operation. The dotted block around the radio receivers 610 and 620, the ADC and DAC, the SAGE 10, the DPR, and the radio I/F in FIG. 21 is meant to indicate that these components may integrated in a PC card device, such as a PC-card that interfaces with the host device 1000. Thus, the card device essentially is a spectrum analyzer device and much more for a radio frequency band, that interfaces to a host device 1000.

Figure 22:
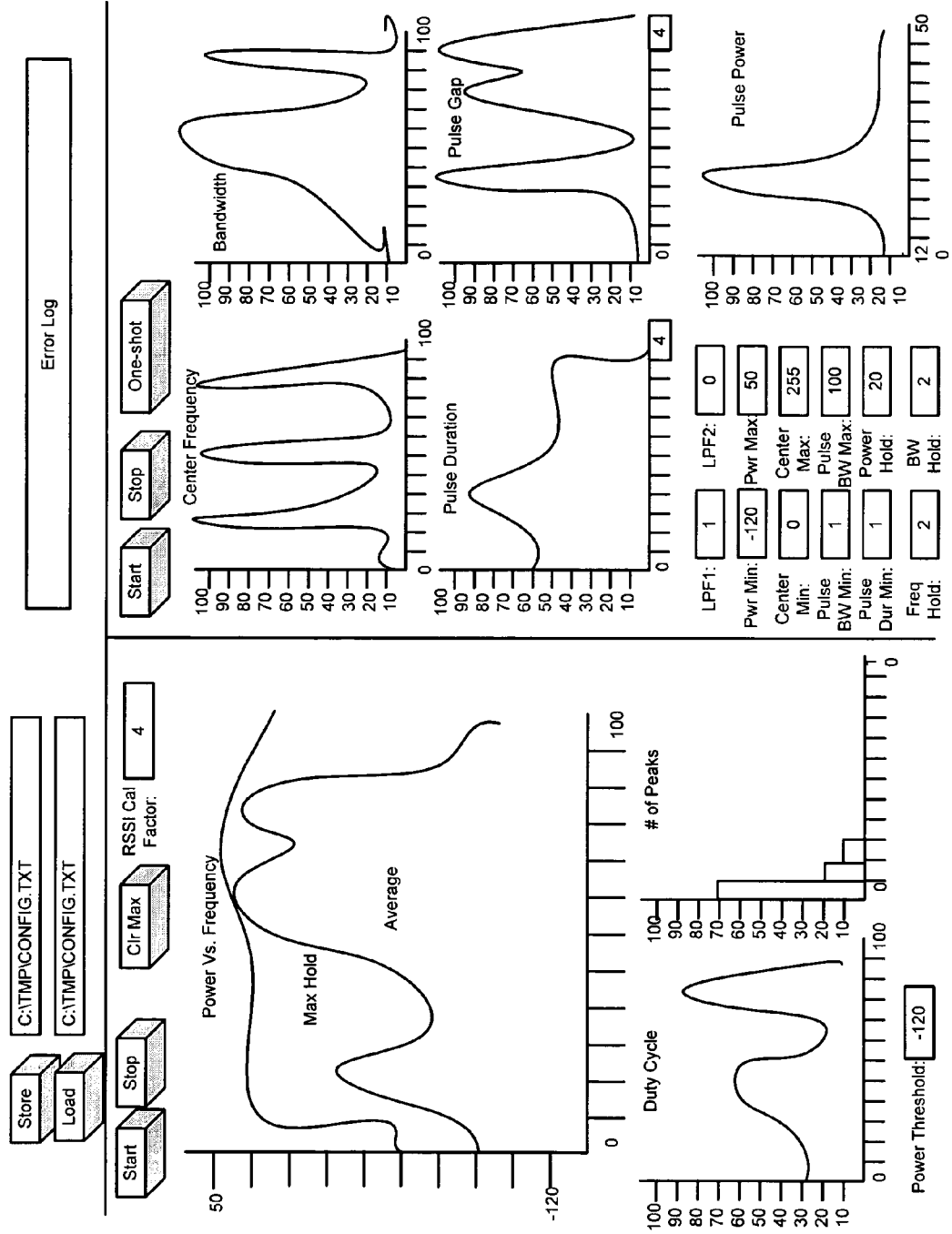
FIG. 22 is a graphical diagram showing an exemplary display of SAGE output.

In this use of the SAGE 10, the host processor 900 performs the functions that are otherwise performed by the MCU 700 to control, and interface with, the SAGE 10, as well as other functions. One use of the SAGE 10 is to display the various outputs of the SAGE 10. For example, an application program residing in the memory 910 of the host device 1000 may generate a graphic user interface display of the SAGE output, as shown in FIG. 22. In addition, there may controls to trigger display of newly captured data as shown by the buttons at the top of FIG. 22.

Moreover, the radio I/F 800, SAGE 10 and DPR 500 are shown in phantom to indicate that all of the functions of these components may be performed by a software program stored in the memory 910 and executed by the host processor 900. In this configuration, the output of the ADC 640 is coupled through an interface, such as the cardbus interface 570 to the host processor 900, which executes processes that would otherwise be performed in hardware by the SAGE 10, as well as the other processes referred to above.

In sum, a signal detector circuit is provided comprising a peak detector that receives as input spectral information for successive time intervals of activity in a frequency band, detects one or more peaks in the spectral information and outputs information identifying peaks for each time interval; and at least one pulse detector coupled to the peak detector, the pulse detector detects signal pulses that satisfy configurable characteristics based on the output of the peak detector. An analogous signal detection method is also provided comprising steps of detecting one or more peaks in spectral information representing activity in a frequency band; and detecting signal pulses that meet one or more characteristics from the detected one or more peaks. The same steps may be implemented by instructions stored on a processor readable medium that, when executed, cause the processor to perform those steps.

Also provided is a system for synchronizing to a communication signal, comprising a clock module, a pulse detector circuit and a processor. The clock module comprises at least N registers, each of which stores a programmable duration value associated with one of two states of a pulse of the communication signal, where N is equal to 2 times the number of pulses in a cycle of the communication signal; a down counter driven by a clock signal that counts down with each clock pulse from a value corresponding to the content of one of the N registers; a mod(N) counter coupled to the down counter that counts up to N−1 by one in response to the down counter reaching zero and when reaching N−1, causing content of the next of the N registers to be loaded into the down counter. The pulse detector circuit detects a signal pulse in the communication signal. The processor is coupled to the clock module and to the signal detector circuit, and examines the count values of the down counter and the mod(N) counter to measure a phase error between the clock signal used to drive the down counter and the pulse of the communication signal.

Similarly, a method is provided for synchronizing to a communication signal, comprising steps of: detecting a pulse of the communication signal; comparing the occurrence of the pulse with a local clock signal; determining a phase error between the occurrence of the pulse and a state of the local clock signal; and delaying or advancing the local clock signal by an amount corresponding to the phase error. This process may also be implemented by instructions encoded on a processor readable medium that, when executed by a processor, cause the processor to perform these same steps.

A method is provided for use in a radio communication device that operates in a frequency band, the method for analyzing activity in the frequency band based on signals received by the communication device, comprising steps of: computing Fast Fourier Transform (FFT) values at a plurality of frequency bins from a digital signal representing activity in a frequency band during a time interval; computing the power at each frequency bin; adding the power at each frequency bin for a current time interval with the power at the corresponding frequency bin for a previous time interval to obtain a running sum of the power at each frequency bin; comparing the power at each frequency bin with a power threshold to obtain a duty count of the number of times that the power at each frequency bin exceeds the power threshold over time intervals; and comparing the power at each frequency bin for a current time interval with the power at the corresponding frequency bin for a previous time interval to track the maximum power in each frequency bin over time intervals. This process may also be implemented by instructions encoded on a processor readable medium that, when executed by a processor, cause the processor to perform these same steps.

Still further provided is a spectrum analysis device for use in a radio communication device that operates in a frequency band, comprising a Fast Fourier Transform (FFT) block that receives as input a digital signal representing activity in the frequency band for a time interval, wherein the FFT block computes FFT values for each of a plurality of frequency bins from the digital signal; a power calculation block that computes the power at each frequency bin and outputs a power data field comprising power values for the plurality of frequency bins; and a signal detector circuit. The signal detector circuit comprises a peak detector that receives as input the power data field for successive time intervals of activity in a frequency band, and detects one or more peaks in the spectral information, the peak detector outputting information identifying peaks for each time interval; and at least one pulse detector coupled to the peak detector that detects signal pulses that satisfy configurable characteristics based on the output of the peak detector. A system may be provided that further includes a clock module comprising: at least N registers, each of which stores a programmable duration value associated with one of two states of a pulse of the communication signal, where N is equal to 2 times the number of pulses in a cycle of the communication signal; a down counter driven by a clock signal that counts down with each clock pulse from a value corresponding to the content of one of the N registers; a mod(N) counter coupled to the down counter that counts up to N−1 by one in response to the down counter reaching zero and when reaching N−1, causing content of the next of the N registers to be loaded into the down counter; and a processor coupled to the clock module and to the signal detector circuit, wherein the processor examines the count values of the down counter and the mod(N) counter to measure a phase error between a clock signal used to drive the down counter and the pulse of the communication signal.

Still further provided is a method for detecting radio signals in a frequency band comprising steps of operating a radio receiver in a wideband mode so as to generate a downconverted signal representing activity in the entire frequency band; performing spectral analysis on the downconverted signal to generate spectral information of the frequency band; and detecting signal pulses of signals expected to be present in the frequency band from the downconverted signal based on knowledge gained from the spectral information of the frequency band.

Yet further provided is a processor readable medium encoded with instructions that, when executed by a processor, cause the processor to perform steps of computing a Fast Fourier Transform (FFT) values for each of a plurality of frequency bins from a digital signal representing activity in a frequency band for a time interval; computing the power at each frequency bin from the FFT values; detecting one or more peaks from the FFT values; and detecting signal pulses that meet one or more characteristics from the detected one or more peaks.

The above description is intended by way of example only and is not intended to limit the present invention in any way.

What is claimed is:

1. A spectrum analysis system comprising:
   a. a Fast Fourier Transform (FFT) circuit that receives as input a digital signal representing received energy for a FFT interval in a frequency band and computes FFT values for a plurality of frequency bins; and
   b. a power calculation circuit coupled to the FFT circuit that computes the power at each frequency bin for an FFT interval and outputs a power value for each frequency bin; and
   c. a duty count circuit coupled to the power calculation circuit that, for an FFT interval, compares the power value for each frequency bin with a threshold and increments a count value when the power value is at or exceeds the threshold for each frequency bin.

2. The spectrum analysis system of claim 1, wherein the duty count circuit compares the power value for each frequency bin with a threshold for a plurality of FFT intervals taken over a time period.

3. The spectrum analysis system of claim 2, and further comprising a memory that stores an indication of the duty cycle for each frequency bin based on the output of the duty count circuit.

4. The spectrum analysis system of claim 3, and further comprising a processor that generates, based on duty cycle count data stored in the memory, display data for a graph that indicates how often the received energy power is at or exceeds the threshold at frequencies of a frequency band.

5. A method for analyzing energy in a frequency band, comprising:
   a. receiving energy in a frequency band;
   b. generating a digital signal representing the received energy;
   c. computing a Fast Fourier Transform (FFT) from the digital signal to generate FFT values for a plurality of frequency bins for an FFT interval;
   d. computing the power at each frequency bin to produce a power value for each frequency bin for an FFT interval; and
   e. comparing the power value for each frequency bin with a threshold to increment a count value when the power value is at or exceeds the threshold for each frequency bin.

6. The method of claim 5, and further comprising repeating (c) computing, (d) computing and (e) comparing for each FFT interval taken from the digital signal, and further comprising tracking the count value for each frequency bin over a plurality of FFT intervals that spans a time period.

7. The method of claim 6, and further comprising storing the count values for each frequency bin for the plurality of FFT intervals.

8. The method of claim 6, and further comprising displaying a graph that indicates how often the received energy power is at or exceeds the threshold at frequencies of a frequency band based on the count values for each frequency bin.

9. The system of claim 1 and further comprising
   b. a peak detector that receives as input output of the power calculation circuit for successive time intervals of activity in a frequency band, detects one or more peaks in the spectral information and outputs information identifying peaks for each time interval; and at least one pulse detector coupled to the peak detector that detects signal pulses that satisfy one or more characteristics based on the output of the peak detector.

10. The system of claim 9, and further comprising a memory that stores one or more of: a running sum of the power at each frequency bin over time intervals; a duty count comprising a running sum at each time interval of the number of times the power at each frequency bin exceeds the threshold; a maximum power for each frequency bin for the current and prior time intervals; and a running count of the number of time intervals in which a certain number of peaks have been detected.

11. The system of claim 9, and further comprising a memory controller coupled to the memory, wherein a pulse detector outputs a trigger signal in response to detecting a certain type of pulse, and wherein the trigger signal is coupled to the memory controller to write to the memory the output of the power calculation block for one or more time intervals.

12. The system of claim 9, and further comprising an RF receiver that downconverts signals received in the frequency band to a baseband signal and an analog-to-digital converter coupled to the RF receiver that converts the baseband signal to a digital signal, wherein the RF receiver is configurable to operate in a wideband mode whereby it downconverts energy in the entire frequency band, or in a narrowband mode whereby it downconverts energy in a portion of the frequency band.

13. The method of claim 5, and further comprising: detecting one or more peaks in spectral information derived from the digital signal band; detecting signal pulses that meet one or more characteristics from the detected one or more peaks; and outputting for each detected signal pulse, one or more of the power, bandwidth, center frequency and duration of the signal pulse.

14. The method of claim 13, wherein detecting a peak comprises detecting power values above a threshold at a contiguous set of frequencies.

15. The method of claim 13, wherein detecting a peak comprises detecting power values that exceed the threshold at contiguous Fast Fourier Transform (FFT) frequency bins.

16. The method of claim 13, and further comprising providing for each detected peak, data including the maximum power value for each peak and frequency bins spanned by the peak.

17. The method of claim 13, wherein detecting a signal pulse comprises detecting, from the peaks, signal pulses of multiple types using an associated set of ranges for one or more of bandwidth, center frequency and duration.

18. The method of claim 13, and further comprising storing digital signals representing samples of a received signal when a pulse of a particular type is detected.

* * * * *